(12) United States Patent
Yasuda

(10) Patent No.: US 8,030,701 B2
(45) Date of Patent: Oct. 4, 2011

(54) MEMORY CELL OF NONVOLATILE SEMICONDUCTOR MEMORY DEVICE

(75) Inventor: Naoki Yasuda, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 56 days.

(21) Appl. No.: 12/560,035

(22) Filed: Sep. 15, 2009

(65) Prior Publication Data

US 2010/0072539 A1   Mar. 25, 2010

(30) Foreign Application Priority Data

Sep. 22, 2008   (JP) .................................. 2008-243042

(51) Int. Cl.
*H01L 29/792* (2006.01)
(52) U.S. Cl. ................. 257/326; 257/324; 257/E29.309
(58) Field of Classification Search .................. 257/324, 257/326, E29.309
See application file for complete search history.

(56) References Cited

U.S. PATENT DOCUMENTS

| | | | | |
|---|---|---|---|---|
| 7,012,299 B2 * | 3/2006 | Mahajani et al. | ............. | 257/324 |
| 7,279,740 B2 * | 10/2007 | Bhattacharyya et al. | ...... | 257/324 |
| 7,391,075 B2 * | 6/2008 | Jeon et al. | ...................... | 257/316 |
| 7,400,009 B2 * | 7/2008 | Lee et al. | ....................... | 257/316 |
| 7,727,908 B2 * | 6/2010 | Ahn et al. | ...................... | 438/785 |
| 7,737,488 B2 * | 6/2010 | Lai et al. | ......................... | 257/325 |
| 2008/0073704 A1 | 3/2008 | Yasuda | | |
| 2009/0078990 A1 | 3/2009 | Yasuda | | |
| 2009/0134448 A1 * | 5/2009 | Jeon et al. | ..................... | 257/324 |

FOREIGN PATENT DOCUMENTS

| JP | 2002-261175 | 9/2002 |
|---|---|---|
| JP | 2005-5715 | 1/2005 |
| JP | 2005-311379 | 11/2005 |

OTHER PUBLICATIONS

Gabriel Molas, et al., "Degradation of Floating-Gate Memory Reliability by Few Electron Phenomena", IEEE Transactions on Electron Devices, vol. 53, No. 10, Oct. 2006, pp. 2610-2619.
A. Furnémont, et al., "A Consistent Model for the SANOS Programming Operation", Proceeding of $22^{nd}$ Non-Volatile Semiconductor Memory workshop, 2007, pp. 96-97.
Yee Chia Yeo, et al., "Direct Tunneling Gate Leakage Current in Transistors with Ultrathin Silicon Nitride Gate Dielectric", IEEE Electron Device Letters, vol. 21, No. 11, Nov. 2000, pp. 540-542.

(Continued)

*Primary Examiner* — Ken A Parker
*Assistant Examiner* — Jose R Diaz
(74) *Attorney, Agent, or Firm* — Oblon, Spivak, McClelland, Maier & Neustadt, L.L.P.

(57) ABSTRACT

A memory cell of a nonvolatile semiconductor memory device according to an embodiment of the invention has a MONOS structure. The charge storage layer of the memory cell includes insulating material layers. The relationship between the conduction band edge energy and valance band edge energy of the insulating material layers either increases gradually or decreases gradually from the tunnel insulating film toward the block insulating film. Furthermore, when the relative permittivity of the block insulating film is expresses as $\in_r$, an energy barrier between the charge storage layer and the block insulating film is equal to or larger than $4.5 \in_r^{-2/3}$ (eV) and is equal to or smaller than 3.8 (eV).

20 Claims, 16 Drawing Sheets

OTHER PUBLICATIONS

Seiichi Miyazaki, "Photoemission Study of Energy-Band Alignments and Gap-State Density Distributions for High-$k$ gate dielectrics", J. Vac. Sci. Technol. B. vol. 19, No. 6, Nov./Dec. 2001, pp. 2212-2216.

H. Y. Yu, et al., "Energy Gap and Band Alignment for $(HfO_2)_x(Al_2O_3)_{1-x}$ on (100) Si", Applied Physics Letters, vol. 81, No. 2, Jul. 8, 2002, pp. 376-378.

M. H. Zhang, et al., "Improved Electrical and Material Characteristics of HfTaO Gate Dielectrics with High Crystallization Temperature", Applied Physics Letters, vol. 87, 2005, pp. 232901-1-232901-3.

S. Maikap, et al., "Band Offsets and Charge Storage Characteristics of Atomic Layer Deposited High -$k$ $HfO_2/TiO_2$ Multilayers", Applied Physics Letters, vol. 90, 2007, pp. 262901-1-262901-3.

V. V. Afanas'ev, et al., "Band Alignment at the Interface of (100) Si with $Hf_xTa_{1-x}O_y$ High-$k$ Dielectric Layers", Applied Physics Letters, vol. 86, 2005, pp. 072108-1-072108-2.

J-Y. Gan, et al., "Dielectric Property of $(TiO_2)_x$-$(Ta_2O_5)_{1-x}$ Thin Films", Appl. Phys. Lett., vol. 72, No. 3, Jan. 19, 1998, pp. 332-334.

K. M. A. Salam, et al., "Effects of Additive Elements on Improvement of the Dielectric Properties of $Ta_2O_5$ Films Formed by Metalorganic Decomposition", Journal of Applied Physics, vol. 93, No. 2, Jan. 15, 2003, pp. 1169-1175.

R. J. Cava, et al., "Improvement of the Dielectric Properties of $Ta_2O_5$ Through Substitution with $Al_2O_3$", Appl. Phys. Lett., vol. 70, No. 11, Mar. 17, 1997, pp. 1396-1398.

Albert Chin, et al., "Low Voltage High Speed $SiO_2/AlGaN/AlLaO_3/$ TaN Memory with Good Retention", IEDM Tech. Dig., 2005, 4 pages.

H. J. Yang, et al., "A Program-Erasable High-$k$ $Hf_{0.3}N_{0.2}O_{0.5}$ MIS Capacitor with Good Retention", IEEE Electron Device Letters, vol. 28, No. 10, Oct. 2007, pp. 913-915.

S. J. Wang, et al., "Effect of Nitrogen Incorporation on the Electronic Structure and Thermal Stability of $HfO_2$ Gate Dielectric", Applied Physics Letters, vol. 88, 2006, pp. 192103-1-192103-3.

G. He, et al., "Temperature-Dependent Interfacial Chemical Bonding States and Band Alignment of $HfO_xN_y/SiO_2/Si$ Gate Stacks", Applied Physics Letters, vol. 91, 2007, 232910-1-232910-3.

N. Lu, et al., "Electrical Properties of Amorphous High-$k$ HfTaTiO Gate Dielectric With Dielectric Constants of 40-60", IEEE Electron Device Letters, vol. 26, No. 5, May 2005, pp. 298-300.

Sheng-Chih Lai, et al., "MA BE-SONOS: A Bandgap Engineered SONOS using Metal Gate and $Al_2O_3$ Blocking Layer to Overcome Erase Saturation", Proceeding of $22^{nd}$ IEEE Non-Volatile Semiconductor Memory Workshop, 2007 pp. 88-89.

S. Maikap, et al., "Very Low Voltage Operation of p-$Si/Al_2O_3/TiO_2/Al_2O_3$/Pt Single Quantum Well Flash Memory Devices with Good Retention", Extended Abstracts of the 2006 International Conference on Solid State Devices and Materials, 2006, pp. 582-583.

* cited by examiner

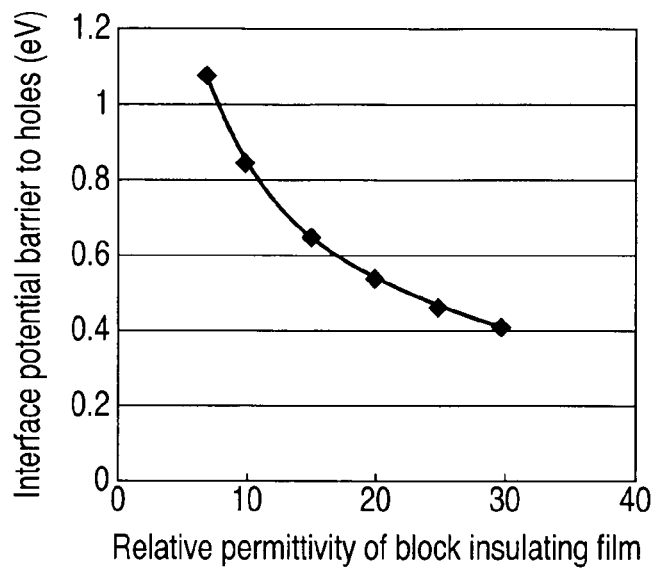

FIG. 7

[Example] If the retention time is defined as a 25% loss

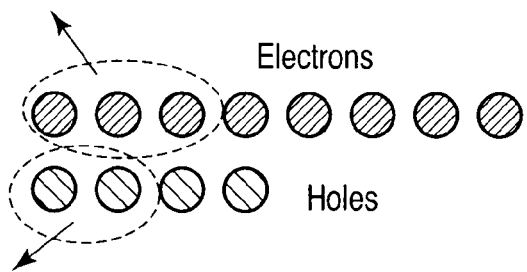

If one of four electrons is lost, the retention time is reached.
(Since the number of electrons is small, the variation is great.)

Since the charge loss due to electron emission is compensated by hole emission, the retention of many electrons is virtually observed.
(Since the number of electrons is large, the variation is small.)

FIG. 8

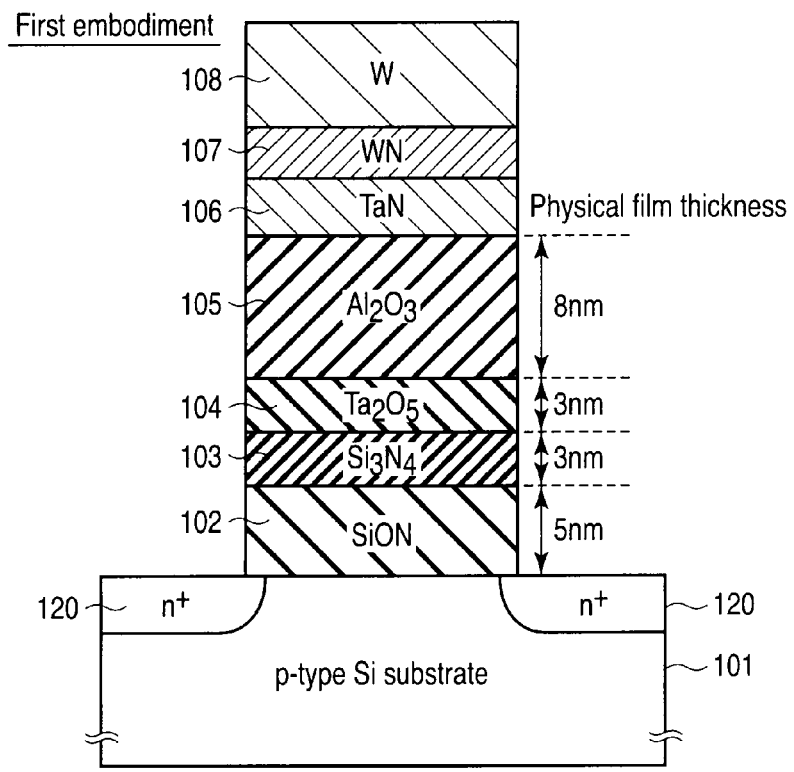
F I G. 1 3
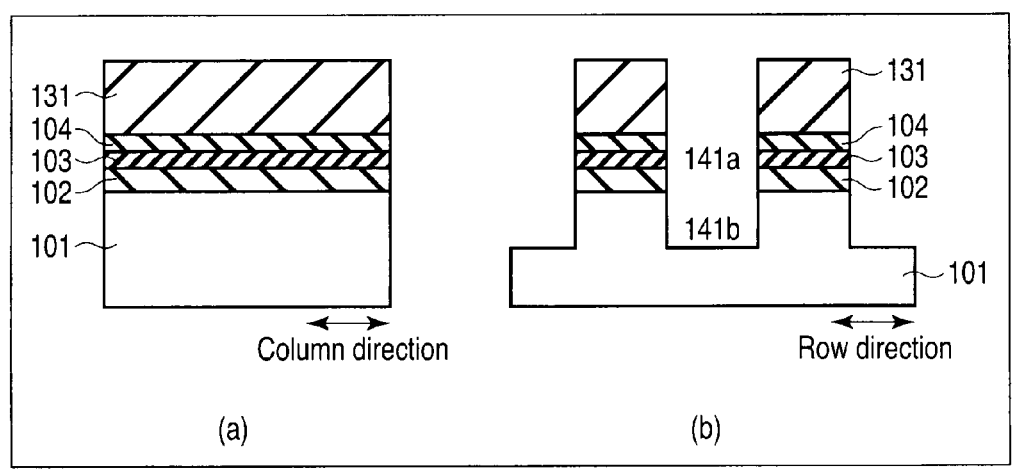
F I G. 1 4

*(TaO$_{5/2}$)$_{0.4}$(HfO$_2$)$_{0.6}$

Eighth embodiment

MEMORY CELL OF NONVOLATILE SEMICONDUCTOR MEMORY DEVICE

CROSS-REFERENCE TO RELATED APPLICATIONS

This application is based upon and claims the benefit of priority from prior Japanese Patent Application No. 2008-243042, filed Sep. 22, 2008, the entire contents of which are incorporated herein by reference.

BACKGROUND OF THE INVENTION

1. Field of the Invention

This invention relates to a memory cell of a nonvolatile semiconductor memory device, and more particularly to a NAND flash memory with MONOS memory cells.

2. Description of the Related Art

A MONOS memory cell is defined as a memory cell whose charge storage layer is comprised of an insulating material that has a charge trap function.

A MONOS memory cell used in a miniaturized NAND flash memory is comprised of a first insulating film formed on an Si substrate, a charge storage layer formed on the first insulating film, a second insulating film formed on the charge storage layer, and a control gate electrode formed on the second insulating film.

The first insulating film is referred to as a "tunnel insulating film." A high electric field is applied to the first insulating film, thereby injecting charges from the Si substrate into the charge storage layer. A silicon oxynitride film into a part of which nitrogen has been introduced to improve the characteristic is often used as the first insulating film. The reason why the first insulating film is referred to as a tunnel insulating film is that charge movement between the charge storage layer and the Si substrate is made by an FN (Flower-Nordheim) tunneling current flowing through the insulating film at the time of writing/erasing.

Furthermore, a silicon nitride film is used as the charge storage layer because the film functions as an insulating film which captures and emits electrons and holes easily. The silicon nitride film may contain some oxygen.

The second insulating film is referred to as a "block insulating film." A material whose insulating quality is higher than that of the first insulating film is used for the second insulating film.

Specifically, a high-permittivity (high-k) insulating film comprised of metal oxide or the like is generally used as the second insulating film. The reason why the second insulating film is referred to as a block insulating film is that charge movement between the charge storage layer and the control gate electrode is blocked by the insulating film at the time of writing/erasing.

Polycrystalline silicon is used for the control gate electrode. In addition to this, a metal, a metal nitride, or a metal carbide gate electrode has been used as the control gate electrode in recent years.

When a MONOS memory cell with a nanometer scale gate length (about 30 nm or less) is formed using these techniques, the following two problems concerning the charge storage layer occur.

The first problem is a charge capture efficiency problem in a silicon nitride film serving as the charge storage layer.

FIG. 1 is an example of plotting the trapped currents obtained from the write/erase characteristics and the theoretical values of the currents flowing through the tunnel insulating film (Fowler-Nordheim tunneling currents) as a function of an effective electric field of the tunnel insulating film in a MONOS (electrode (e.g., metal)-oxide-nitride-oxide-silicon) structure. The symbols indicate data points and the thick solid lines represent a theoretical formula of an electron current and that of a hole current.

As seen from FIG. 1, the silicon nitride film has trapped only an amount of charges much less than the theoretical value of current (Fowler-Nordheim tunneling current) flowing through the tunnel insulating film in the high electric-field region. That is, in the high electric-field region, the charge capture efficiency of the silicon nitride film decreases.

This tendency is not so serious in trapping holes. When electrons are trapped, the trapped current in a high electric-field region is one digit or more smaller than the injected current (Flower-Nordheim tunneling current), with the result that the charge trapping rate is as low as 10% or less. In this state, without applying a high voltage to the control gate of the memory cell, there is a problem that the desired threshold voltage shift cannot be obtained. Moreover, since the amount of charge passing at the time of writing/erasing is large, this causes the problem of decreasing the reliability of the memory cell.

A second problem is that, as the memory cell is miniaturized further, the number of trapped electrons (in writing) or the number of trapped holes (in erasing) decreases.

Typically, the number of trapped carriers in a memory cell with a gate length of the order of 10 nm is on the order of several tens of carriers. A phenomenon intrinsically occurring with the decrease in the number of carriers in the memory cell causes the following problem: a variation in the retention characteristic increases.

Specifically, for example, as has been discussed in G. Molas, D. Deleruyelle, B. De Salvo, G. Ghibaudo, M. Gely, L. Perniola, D. Lafond, and S. Deleonibus, "Degradation of Floating-Gate Memory Reliability by Few Electron Phenomena," IEEE Trans. Electron Devices, 53, 2610 (2006), the retention time of a memory cell varies due to the random nature of the emission of trapped charges. Therefore, when a set of many memory cells is used, a problem of "tail bits" whose retention time is short inevitably occurs.

BRIEF SUMMARY OF THE INVENTION

A memory cell of a nonvolatile semiconductor memory device according to an aspect of the present invention comprises a first insulating film which is arranged on a semiconductor substrate, a charge storage layer which is arranged on the first insulating film and which includes insulating material layers, a second insulating film which is arranged on the charge storage layer and whose permittivity is higher than that of the first insulating film, and a control gate electrode which is arranged on the second insulating film, wherein, when the insulating material layers included in the charge storage layer are represented as i=1, 2, ..., n, starting from the first insulating film side toward the second insulating film side, the energy at the conduction band edge of each of the individual layers is expressed as $\phi_{c,i}$ (i=1, 2, ..., n), and the energy at the valence band edge is expressed as $\phi_{v,i}$ (i=1, 2, ..., n), the conduction band edge energy and valence band edge energy of adjacent layers satisfy one of ($\phi_{c,i+1} > \phi_{c,i}$ and $\phi_{v,i+1} > \phi_{v,i}$) and ($\phi_{c,i+1} < \phi_{c,i}$ and $\phi_{v,i+1} < \phi_{v,i}$) where i=1, 2, ..., n, and, when the relative permittivity of the second insulating film is expressed as $\in_r$, a potential barrier to electrons defined as the difference between the lowest conduction band edge energy level in the charge storage layer and conduction band edge energy level in the second insulating film is not lower than $4.5 \in_r^{-2/3}$ (eV) nor higher than 3.8 (eV) and a potential barrier to holes defined as the difference between the highest valence band edge energy level in the charge storage layer and the valance band edge energy level in the second insulating film is equal to or larger than $4.5 \in_r^{-2/3}$ (eV) and is equal to or smaller than 3.8 (eV).

Here, the energy $\phi_{c,i}$ and energy $\phi_{v,i}$ (i=1, 2, . . . , n) are defined as energy for electrons existing in the charge storage layer in a state where no external electric field is applied (or in a flat band state). In addition, the relative permittivity of the second insulating film is defined as the ratio of the permittivity of the insulating film to the permittivity of vacuum.

BRIEF DESCRIPTION OF THE SEVERAL VIEWS OF THE DRAWING

FIG. 7 is a characteristic diagram showing the relationship between the relative permittivity of the block insulating film and the minimum necessary potential barrier concerning holes;

FIG. 8 is a diagram to help explain an improvement in the retention time by separating the electron and hole trapping positions;

FIGS. 12 and 13 are sectional views, each showing the structure of a memory cell according to a first embodiment;

FIGS. 14 to 18 are sectional views, each showing a method of manufacturing the memory cell structure of the first embodiment;

DETAILED DESCRIPTION OF THE INVENTION

Figure 1:
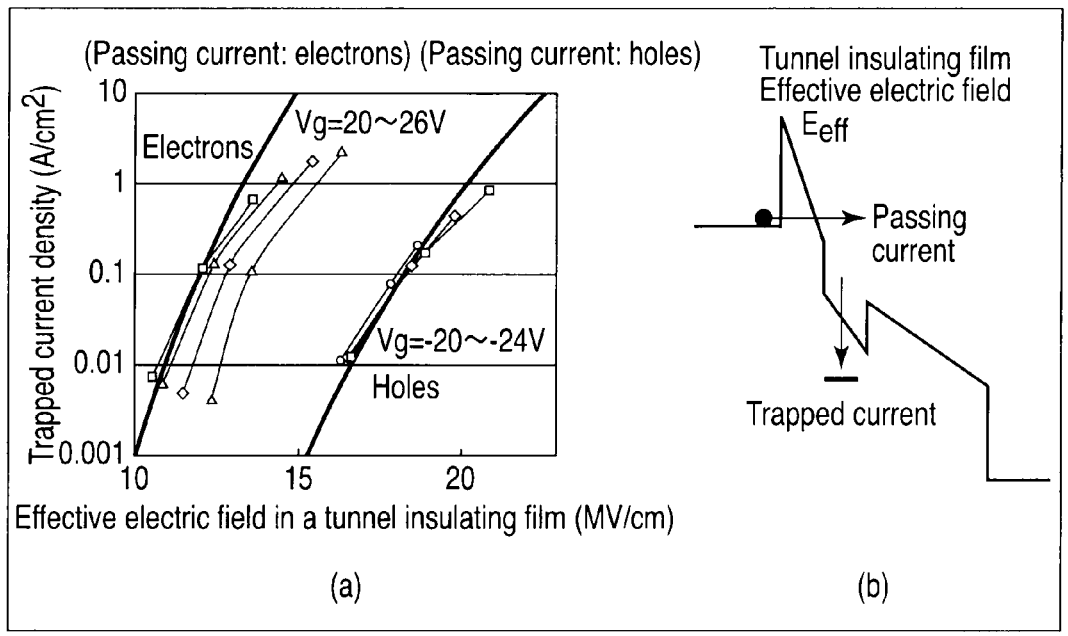
FIG. 1 is a characteristic diagram showing the relationship between an effective electric field, a trapped current density, and a passing current density in a tunnel insulating film.

A memory cell of a nonvolatile semiconductor memory device of an aspect of the present invention will be described in detail with reference to the accompanying drawings.

1. Principle of the Invention

First, the concept of the present invention will be described. This invention provides the structure of a MONOS memory cell which has a high charge capture efficiency and a good retention time.

A first characteristic of the invention is that a memory cell is configured by using a combination of a charge storage layer and a block insulating film, with a high potential barrier (or band offset) between the charge storage layer and block insulating film. With this configuration, the passage of charges from the charge storage layer to the block insulating film at the time of writing/erasing is suppressed, increasing the charge capture efficiency.

A second characteristic of the invention is that the insulating film of the charge storage layer is comprised of a plurality of layers which contain the junctions made up of high potential regions and low potential regions. That is, a potential profile, such as "p-n junctions" made up of insulating films, is formed in the charge storage layer, which separates the positions of electrons and holes stored in the charge storage layer. As described later, the separation of electrons and holes improves the average time of retention and reduces a variation in the retention time.

Hereinafter, concrete film structures corresponding to the above two descriptions will be explained in a quantitative and physical manner.

First, the height of the potential barrier between the charge storage layer and block insulating film constituting the first characteristic of the present invention will be explained quantitatively. According to a model of the write characteristic of a MONOS memory cell (e.g., refer to A. Furnemont, M. Rosmeulen, A. Cacciato, L. Breuil, K. De Meyer, H. Maes, and J. Van Houdt, "A Consistent Model for the SANOS Programming Operation," pp. 96-97, in 22nd IEEE Non-Volatile Semiconductor Memory Workshop (2007)), it is the passage of charges from the charge storage layer to the block insulating film that determines the charge capture efficiency when a pulse voltage is applied to a MONOS memory cell for a short time.

According to the model described in the above document, the electrons injected from the Si substrate via a tunnel insulating film to the charge storage layer form a two-dimensional subband in the conduction band at the interface between the charge storage layer (silicon nitride film) and the block insulating film (alumina). The injected electrons can go over the energy barrier of the charge storage layer/block insulator interface, using a tunneling probability process with a certain attempt frequency during the period from the arrival of the electrons at the two-dimensional subband to the Mean Free Time (MFT).

However, when the electrons stay in the two-dimensional subband for the mean free time (MFT) or longer, they are subject to the electron lattice interaction. As a result, the injected electrons are stored in the charge storage layer (silicon nitride film).

Figure 2:
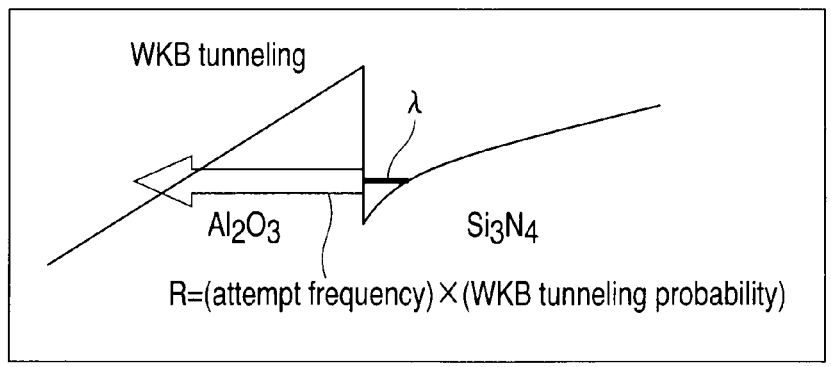
FIG. 2 is a conceptual diagram to help explain the way electrons pass from the charge storage layer to the block insulating film.

In the above reference document, no specific equation for the model has been given. Therefore, the inventor of this invention has tried to formulate the model as follows. The rate R per unit time at which electrons existing in the two-dimensional subband of the interface between the charge storage layer and block insulating film go out into the block insulating film is expressed as the product of the attempt frequency and tunneling probability (see FIG. 2):

$$R = (\text{attempt frequency}) \times (\text{tunneling probability}) \quad (1)$$

In equation (1), the attempt frequency is the number of times an electron attempts to go out of the two-dimensional subband of the interface into the block insulating film. Let the width of the subband (the width in the film thickness direction) be $\lambda$. Taking into account the fact that, when an electron goes and returns over a width of $2\lambda$, the chance to experience a tunneling process to go outside is given once, the attempt frequency is expressed using the speed of an electron v as follows:

$$f = \frac{v}{2\lambda} \quad (2)$$

When an electron exists in the lowest subband, the speed of the electron is expressed as:

$$v = \frac{p}{m} = \frac{(\hbar/\lambda)}{m} = \frac{\hbar}{m\lambda} \quad (3)$$

Here, p is the momentum of the electron and m is the mass of the electron. In equation (3), the following relation (uncertainty principle) holding for electrons in the lowest subband has been used:

$$p\lambda = \hbar \quad (4)$$

From equation (2) and equation (3), the attempt frequency f is expressed as:

$$f = \frac{\hbar}{2m\lambda^2} \quad (5)$$

The formulation of the width $\lambda$ of the lowest subband will be explained in detail. Using the relation (uncertainty principle) expressed by equation (4), a condition for minimizing the total energy, that is, the sum of the kinetic energy and potential energy, is introduced, giving the following calculation result:

$$\lambda = \left(\frac{\hbar^2}{mqE}\right)^{1/3} \quad (6)$$

Here, E indicates an electric field actual electric field) in the charge storage layer. In a real operation of the MONOS memory cell, a write/erase operation is carried out in a region with an effective electric field ($SiO_2$ equivalent electric field) $E_{eff}$ of about 20 MV/cm ($E_{eff}$=20 MV/cm). Normally, a silicon nitride film is used as an insulating film material for the charge storage layer. In this case, the actual electric field E is about 10 MV/cm, taking the relative permittivity of the silicon nitride film into account. Then, from equation (6), equation (7) is obtained:

$$\lambda = 0.4 \text{ (nm)} \quad (7)$$

Hereinafter, the subband width is approximated by equation (7). The actual electric field E corresponding to $E_{eff}$=20 MV/cm varies slightly with the permittivity of the material constituting the charge storage layer. As a result, the subband width in equation (6) also varies slightly. In equation (1), however, the most dominant factor that determines the rate R of charge emission into the block insulating film is the tunneling probability of an electron which is expressed as an exponential function of an electric field. Accordingly, even though the subband width is approximated by equation (7) and the attempt frequency varies slightly, the rate R of charge emission remains virtually unchanged. For the same reason, even if the effective mass m of an electron changes slightly in equation (6), the rate R does not change significantly.

On the basis of what has been described above, the attempt frequency is determined from equation (5) and equation (7), giving f=3×10$^{14}$ (Hz).

Meanwhile, the tunneling probability in equation (1) is calculated by WKB (Wentzel-Kramers-Brillouin) approximation. At that time, consideration is made so that either direct tunneling or FN (Fowler-Nordheim) tunneling may be calculated, taking the film thickness of the block insulating film into account. Normally, the block insulating film is rather thick and FN tunneling is realized.

Figure 3:
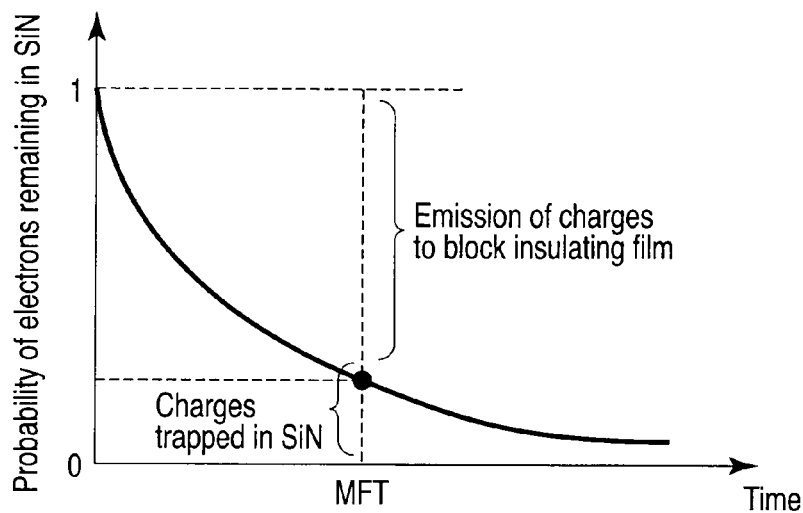
FIG. 3 is an explanatory diagram showing a temporal change in the probability that electrons will remain in the charge storage layer.

When the calculated WKB tunneling probability is represented as $P_{WKB}$, the probability $P_{trap}$ that electrons will be stored in the charge storage layer is expressed as with reference to FIG. 3:

$$P_{trap} = \exp(-f \times P_{WKB} \times MFT) \quad (8)$$

Here, on the basis of the comparison between the actual measurement result of the write characteristic of the MONOS memory cell and the model equation, the mean free time is determined to be:

$$MFT = 6 \times 10^{-14} \text{ (s)} \quad (9)$$

It should be noted that, in the model equation, the charge capture efficiency in an actual operation of the MONOS memory cell is determined as a function of the potential barrier height between the charge storage layer and block insulating film and the relative permittivity of the block insulating film. The dominant factor $P_{WKB}$ in the charge capture efficiency is determined by the potential barrier height and the electric field (actual electric field) in the block insulating film. In the case of a specific effective electric field used in a write/erase operation, the actual electric field varies in inverse proportion to the relative permittivity of the block insulating film. Accordingly, it would be safe to say that $P_{WKB}$ is a function of the relative permittivity of the block insulating film.

On the basis of the model, the effective electric field dependence of the electron capture efficiency of a MONOS memory cell where the block insulating film was made of alumina (with a relative permittivity of 11) was calculated as an example.

Figure 4:
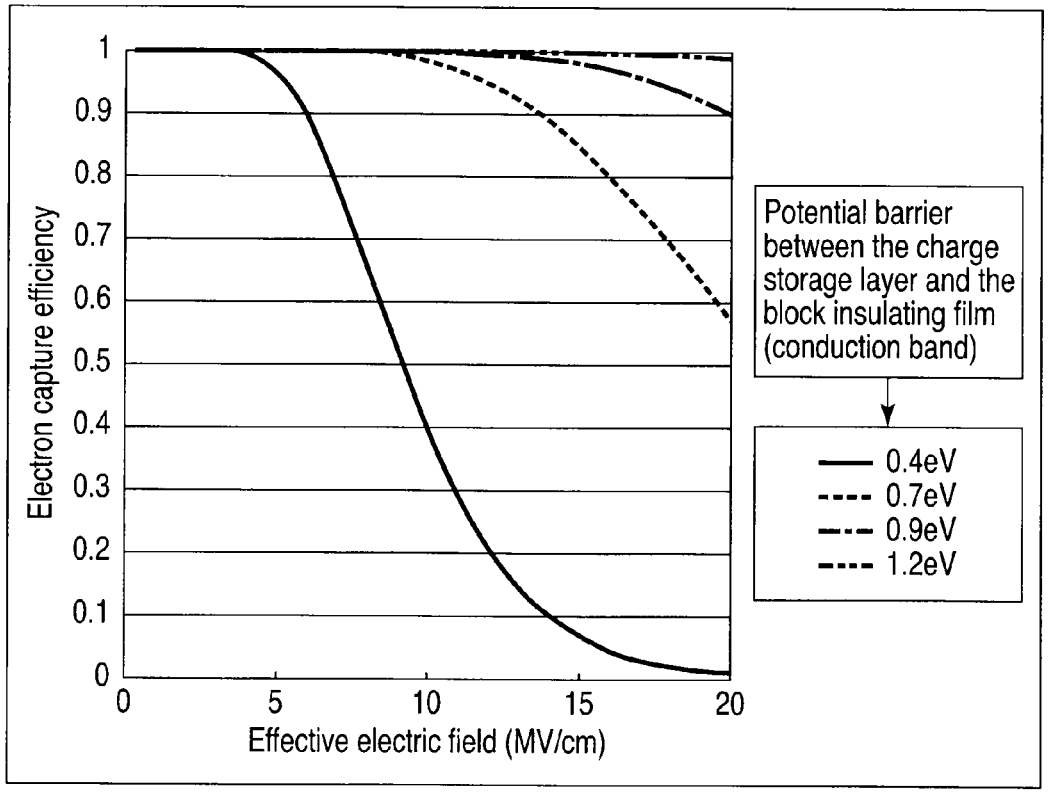
FIG. 4 is a characteristic diagram showing the relationship between an effective electric field and the electron capture efficiency when the block insulating film is alumina.

The calculation result is shown in FIG. 4. As seen from FIG. 4, although the electron capture efficiency decreases as the electric field becomes higher, the degree of the decrease depends largely on the potential barrier height.

When attention is paid to $E_{\mathit{eff}}$=20 MV/cm, a typical operating electric field in a write operation of the MONOS memory cell, the electron capture efficiency approaches zero when the potential barrier height is at 0.4 eV. In the configuration of a typical MONOS memory cell where a silicon nitride film (with a conduction band offset of 2.1 eV for Si) is used as the charge storage layer and alumina (with a conduction band offset of 2.4 eV for Si) is used as the block insulating film, the potential barrier height is at about 0.3 eV. In that case, the electron capture efficiency should have decreased further than that in the calculation example of FIG. 4.

Specifically, in a memory cell with an ordinary MONOS structure (gate electrode/Al$_2$O$_3$/Si$_3$N$_4$/SiON/Si substrate) where the block insulating film is alumina, the potential barrier height between the charge storage layer and block insulating film cannot be said to be sufficient. Accordingly, to realize a high-performance memory cell, it is essential that the MONOS structure should be comprised of a material system with a higher potential barrier height.

Here, to provide a guideline for selecting a material system with a sufficiently large potential barrier between the charge storage layer and block insulating film, a criterion is set for a desirable carrier capture rate. The fact that both the electron capture rate (in writing) and the hole capture rate (in erasing) are 90% or more is used as the criterion for determining whether the carrier capture rate is good or bad.

The criterion follows a case where a degradation of around 10% is often used as the criterion for the amount of semiconductor device degradation. As an example, in the case of the degradation of a MOS transistor due to hot carriers, a 10% degradation of mutual conductance is often used as the criterion.

Next, the criterion for the carrier capture rate and a method of analyzing the carrier capture rate using equations (1), (5), (7), (8), and (9) are applied to an arbitrary system of the charge storage layer and block insulating film. By doing this, favorable potential barrier between the charge storage layer and block insulating film is generally shown.

Figure 5:
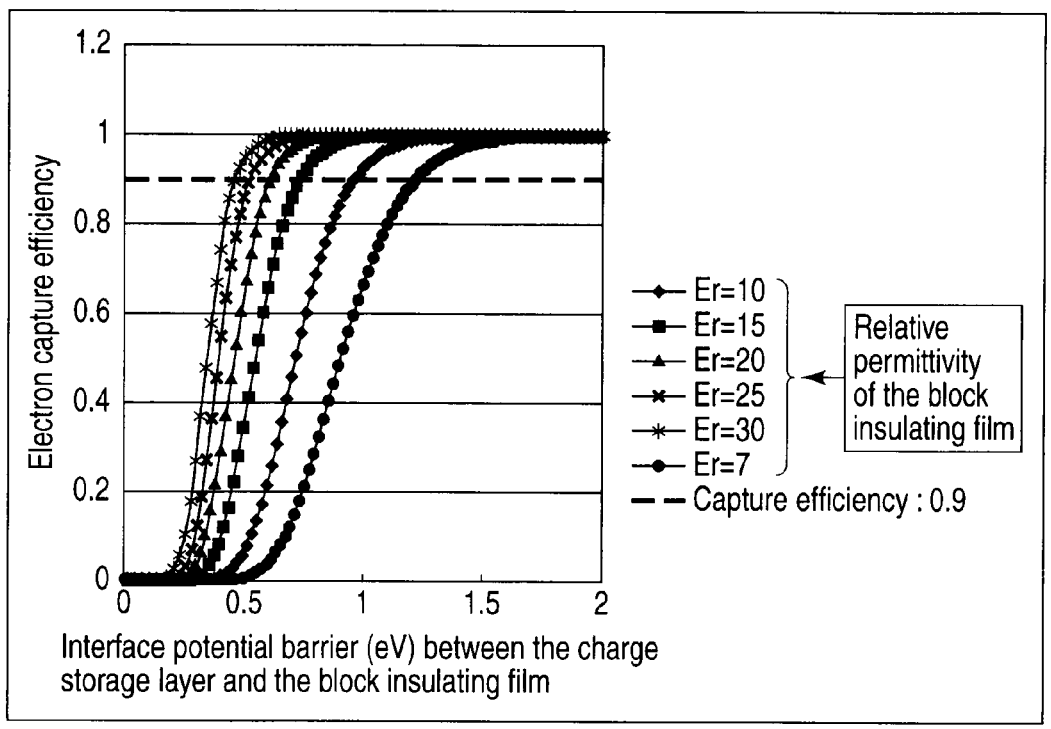
FIG. 5 is a characteristic diagram showing the relation of a potential barrier between the charge storage layer and the block insulating film to the electron capture efficiency.

FIG. 5 shows the result of calculating the electron capture efficiency when an effective electric field $E_{\mathit{eff}}$ of 20 MV/cm ($E_{\mathit{eff}}$=20 MV/cm) is used as a typical operating electric field of a MONOS memory. The electron capture efficiency was calculated as a function of the electron potential barrier height at the interface between the charge storage layer and block insulating film and the relative permittivity of the block insulating film. As seen from FIG. 5, since the actual electric field in the block insulating film becomes smaller as the relative permittivity of the block insulating film increases, the tunneling probability of electrons decreases accordingly. As a result, the electron capture efficiency for the same potential barrier increases.

Figure 6:
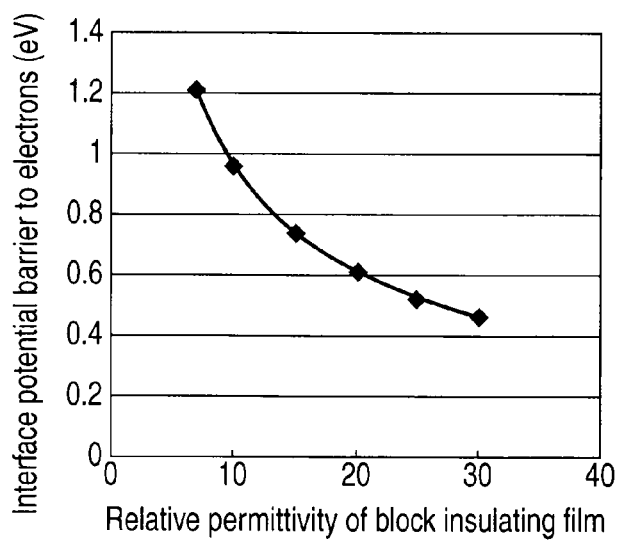
FIG. 6 is a characteristic diagram showing the relationship between the relative permittivity of the block insulating film and the minimum necessary potential barrier concerning electrons.

From FIG. 5, the height of the interface potential barrier at which the electron charge capture efficiency is 90% can be determined. The result is shown in FIG. 6. From FIG. 6, the minimum condition required for the potential barrier between the charge storage layer and block insulating film (potential barrier to electrons) $\Delta\phi_e$ is expressed by the following equation as a function of the relative permittivity $\in_r$ of the block insulating film:

$$\Delta\phi_e = \frac{4.5}{\varepsilon_r^{2/3}} \text{ (eV)} \tag{10}$$

Next, the valance band side was also analyzed similarly. The result is shown in FIG. 7.

From FIG. 7, the minimum condition required for the potential barrier between the charge storage layer and block insulating film (potential barrier to holes) $\Delta\phi_h$ is expressed by the following equation as a function of the relative permittivity of the block insulating film:

$$\Delta\phi_h = \frac{4.0}{\varepsilon_r^{2/3}} \text{ (eV)} \tag{11}$$

A major reason why the value of the requirement for the potential barrier obtained from the above calculations differs between electrons and holes is that the "tunnel effective mass" appearing in the calculation of WKB tunneling probability differs between electrons and holes. (The tunneling effective mass of electrons was assumed to be 0.42 m$_e$ and that of holes was assumed to be 0.6 m$_e$, where m$_e$ is the mass of a free electron.)

In the calculation results, the film thickness of the block insulating film does not appear. The reason for this is that the block insulating film is normally relatively thick and writing/erasing is performed under the condition where FN tunneling takes place.

Each of equation (10) and equation (11) shows the minimum value that the potential barrier to electrons or holes has to satisfy. Although the maximum value that the potential barrier has to satisfy is not specified, it is appropriate that the maximum value should be 3.2 eV for electrons and 3.8 eV for holes. The reason for this is that it is conceivable that it is a silicon oxide film that has the lowest permittivity and highest potential barrier among the insulating films which are likely to be used as a second insulating (or block insulating) film.

In this case, even if Si, whose conduction band edge energy level is low, is used as the charge storage layer, the band offset between the charge storage layer and block insulating film is 3.2 eV for electrons and 3.8 eV for holes. It does not happen normally that a band offset exceeding these is realized. However, when GaN is exceptionally used for a part of the charge storage layer, the conduction band offset is 0.6 eV lower than that of silicon. In this case, the maximum value of the energy barrier to electrons should be considered up to 3.8 eV (=3.2+0.6).

What has been described above is summarized as follows. As for the height of the potential barrier between the charge storage layer and block insulating film which comprises the first characteristic of the invention, when the relative permittivity of the second insulating film (or block insulating film) is $\in_r$, a MONOS memory cell is so configured that the potential barrier to electrons is not lower than 4.5 $\in_r^{-2/3}$ (eV) nor higher than 3.8 (eV) and the potential barrier to holes is not lower than 4.0 $\in_r^{-2/3}$ (eV) nor higher than 3.8 (eV).

In the invention, the charge storage layer is comprised of a plurality of layers. In this case, the difference between the lowest one of the conduction band energies of the charge storage layers and the conduction band edge energy of the block insulating film should be made not lower than $4.5 \in_r^{-2/3}$ (eV) nor higher than 3.8 (eV). The difference between the highest one (or the lowest one for holes) of the valence band energies of the charge storage layers and the valence band edge energy of the block insulating film should be made not lower than $4.0 \in_r^{-2/3}$ (eV) nor higher than 3.8 (eV).

The above explanation has been given for a case where the block insulating film is comprised of a single layer. When the block insulating film is comprised of a stacked film, it is appropriate that the conduction band edge energy and valence band edge energy of the block insulating film should take values in the vicinity of the interface with the charge storage layer.

Next, it is noted that a junction of a high potential layer and a low potential layer constitutes the second characteristics of the invention. The reason why the charge storage layer comprised of the junction leads to an improvement in the retention time of a MONOS memory cell will be explained from a physical viewpoint. The retention time is defined as the time required for the charge in the charge storage layer of a MONOS memory cell to decrease to a predetermined reference value. For example, 95% of the initial charge amount may be used as the reference value.

When memory cells are miniaturized, the amount of charges in a cell decreases. As a result, the random nature of charge emission become conspicuous and the retention time varies. Accordingly, for example, as straightforwardly shown in FIG. 15 in G. Molas, D. Deleruyelle, B. De Salvo, G. Ghibaudo, M. Gely, L. Perniola, D. Lafond, and S. Deleonibus, "Degradation of Floating-Gate Memory Reliability by Few Electron Phenomena," IEEE Trans. Electron Devices, 53, 2610 (2006), "tail bits" whose retention time is extremely short develop in a set of many memory cells. This phenomenon essentially occurs when the number of charges in the charge storage layer is small and is difficult to avoid. Thus, as long as carriers of a single type are used, the only solution to this problem would be to increase the number of carriers.

Accordingly, attention has been given to the following point. Unlike a conventional floating-gate nonvolatile memory cell which has its charge storage layer comprised of a conductor or a semiconductor, a MONOS memory cell has its charge storage layer comprised of an insulating material. Since charges accumulate in the insulating material as a result of local charge capture, all of the electrons and holes injected into the charge storage layer do not necessarily recombine. The electrons and holes can exist together without recombination. With the coexistence of electrons and holes, the absolute number of carriers in the charge storage layer increases, suppressing a variation in the characteristic of the memory cell. Moreover, the sign of the charge amount of electrons emitted is the reverse of that of holes; the electrons and the holes cancel each other from the viewpoint of the increase and decrease of the total charge amount. That is, even if carriers are emitted, the average time of retention is expected to get longer since a change in the total charge amount is suppressed.

This will be explained in more detail using a concrete example.

As an example, FIG. 8 shows a case where only electrons exist in the charge storage layer and a case where electrons and holes exist together in the charge storage layer. When "retention time" is defined as the time when a certain percentage (25% in this example) of the amount of trapped charges has been lost, the retention time is reached when only one of four electrons is lost in a case where only electrons exist. In contrast, when electrons and holes exist together, not only electrons but also holes are emitted. Since the sign of the emitted electrons is the reverse of that of the emitted holes, they cancel each other in terms of the effective amount of charges emitted from the charge storage layer. For example, in FIG. 8, the retention time is reached only when three electrons are emitted for the escape of two holes. As seen from this example, use of the coexistence of electrons and holes makes the average time of retention longer, improving the retention characteristic. Detailed calculations done by the inventors have shown that a variation in the retention time can be suppressed as a result of the emission of more carriers relative to the case when carriers of one type are used.

Figure 9:
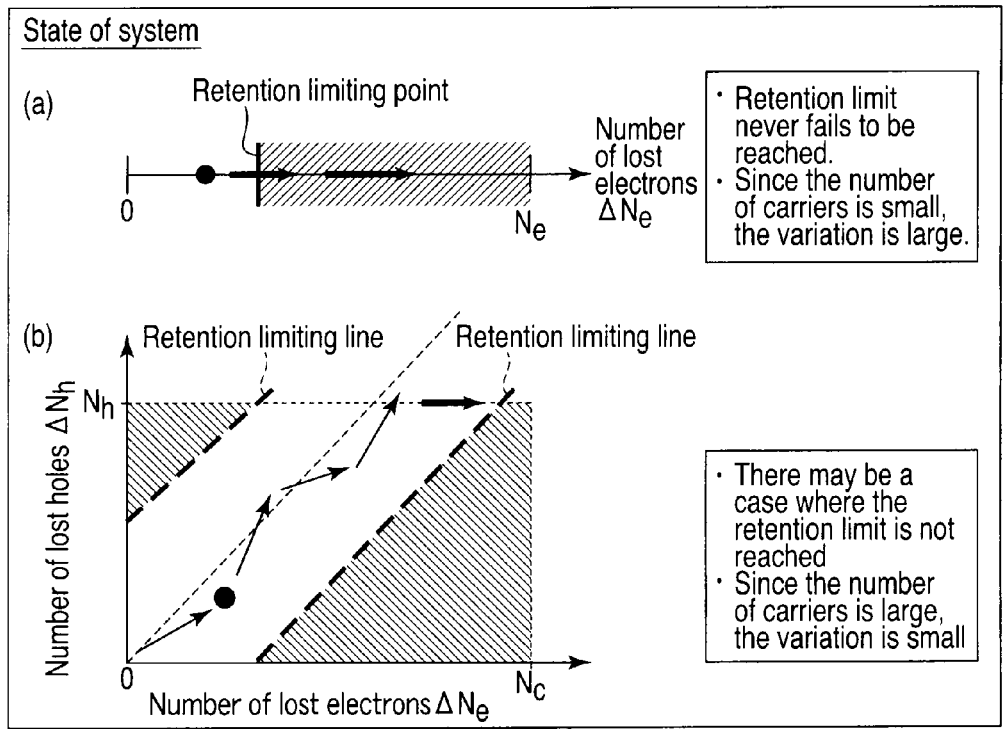
FIG. 9 is a state diagram of the charge storage layer where electrons and holes exist together.

What has been described above will be confirmed with reference to a state diagram in FIG. 9.

When carriers of one type are captured, carriers keep on escaping in the data retention process. Consequently, the retention time never fails to be reached and the retention time varies seriously because the number of carriers is small. In contrast, when electrons and holes exist together, since electron emission and hole emission compensate for each other, the retention time is not reached as long as they balance each other. That is, the retention characteristic is kept satisfactorily. Moreover, both electrons and holes need more emission than in the case of carriers of one type, with the result that the participation of many carriers suppresses a variation in the characteristic.

In the capture of two types of carriers, trapped electrons and trapped holes partially cancel each other, thereby decreasing the initial effective number of trapped carriers. Therefore, utilizing the merits of capturing the two types of carriers (electrons and holes) is based on the assumption that both electron capture efficiency and hole capture efficiency are high during write/erase operations and many carriers can be captured. In the invention, this is secured by raising the potential barrier between the charge storage layer and block insulating film on both the conduction band side (or electron side) and the valence band side (or hole side) to improve the carrier capture efficiency.

It is seen from what has been described that the average time and a variation in the retention can be improved by trapping the two types of carriers (electrons and holes) in the charge storage layer and causing them to exist together.

Figure 10:
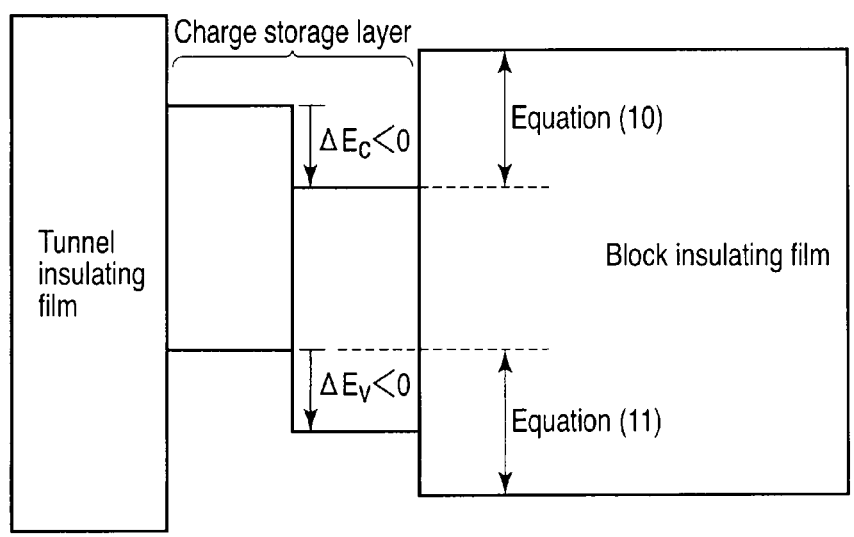
FIG. 10 is a conceptual diagram of the energy band structure of a memory cell according to the invention.

Next, the effective way of creating the coexistence of electrons and holes will be explained. The invention employs a method of making a so-called "p-n junction" in an insulating film used as the charge storage layer. An example of the method is shown in FIG. 10.

Specifically, the insulating film of the charge storage layer is comprised of a plurality of layers. At the interface of each layer, both the band offset difference of the conduction band and that of the valence band are made negative or both the band offset difference of the conduction band and that of the valence band are made positive.

When the relationship between the band offsets of the adjacent insulating film layers is formed as described above, electrons are trapped mainly in the layer with the lowest conduction band edge energy and holes are trapped mainly in the layer with the highest valence band edge energy (or the lowest energy layer for holes). Accordingly, the electron trapping position and the hole trapping position can be separated physically.

By doing this, electrons and holes cannot recombine easily because there is an energy barrier between the electron trapping region and the hole trapping region. Consequently, use of this structure for the charge storage layer enables the coexistence of electrons and holes effectively.

When a silicon nitride film is used as a part of the insulating film of the charge storage layer, it is desirable that the configuration should be such that a silicon nitride film is used on the tunnel insulating film side and a high-k insulating film whose permittivity is higher than that of the silicon nitride film is used on the block insulating film side (as in FIG. 10). In this case, since the high-k insulating film where electrons are mainly trapped is away from the tunnel insulating film, an improvement in the retention characteristic after writing is expected and the configuration is suitable for the multilevel operation of the memory cells.

For the same reason, it is generally desirable that an insulating film including more nitrogen be located closer to the tunnel insulating film side. That is, the lower the nitrogen concentration of the insulating film, the greater the tendency of the insulating film to function as an electron trapping region. Accordingly, when the nitrogen-enriched insulating material film of the charge storage layer is located on the tunnel insulating film side and the less-nitrogen-enriched one is located on the block insulating film side, an improvement in the retention characteristic after writing can be expected. Since the valence band offset of the nitrogen-enriched insulating film is at a high energy level, the insulating film functions mainly as a hole trapping region. The fact that the hole trapping region is close to the tunnel insulating film is favorable from the viewpoint of increasing the erase efficiency, as well.

To realize the coexistence of electrons and holes after a write/erase operation, it is necessary to slightly modify the writing/erasing method. Specifically, in a write operation, after a little too much data has been written with electron injection, an erase pulse is applied for a short time to inject holes, thereby causing both types of carriers to exist together. Similarly, in an erase operation, after a little too much data has been erased with hole injection, a write pulse is applied for a short time to inject electrons, thereby causing both types of carriers to exist together.

2. Reference Example

Before an explanation of embodiments of the invention, a reference example of the invention will be explained.

Figure 11:
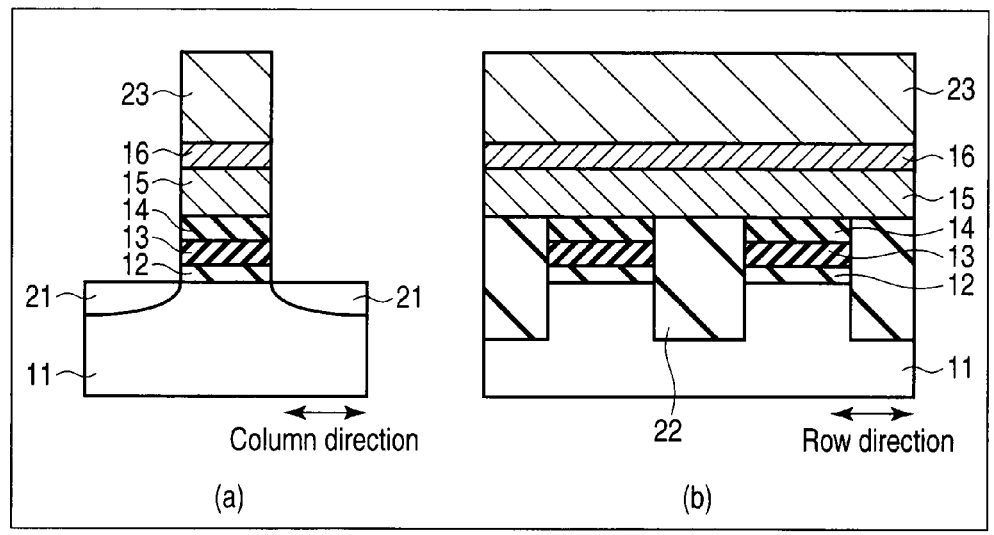
FIG. 11 is a sectional view showing the memory structure of a reference example.

FIG. 11 shows a memory cell related to a reference example of the invention.

The memory cell is an ordinary MONOS memory cell where the charge storage layer is comprised of a single-layer insulating film. FIG. 11(a) is a sectional view taken in the channel length direction and FIG. 11(b) is a sectional view take in the channel width direction. In these figures, the channel length direction is the column direction in which a bit line extends. The channel with direction is the row direction in which a word line (or a control gate electrode) extends.

First, as shown in FIG. 11(a), at the surface of a p-type-impurity-doped silicon substrate (including a well) 11, two source/drain diffusion layers 21 are arranged separately. A part between the source/drain diffusion layers 21 is a channel region. When the memory cell goes into an ON state, a channel which is to electrically conduct the two source/drain diffusion layers 21 is formed in the channel region.

On the channel region, for instance, a tunnel $SiO_2$ film (first insulating film) 12 of about 3 to 4 nm thick is arranged. Stacked on the first insulating film 12 are a silicon nitride film 13 (charge storage layer) of about 5 to 10 nm thick, alumina (second insulating film) 14 of 10 to 20 nm thick, and a phosphorus-doped polycrystalline silicon film (control gate electrode) 15 of 100 nm thick. On the phosphorus-doped polycrystalline silicon film 15, barrier metal 16 and a word line 23 are arranged. The word line 23 is comprised of, for example, a conducting film of about 100 nm thick made of tungsten.

The source/drain diffusion layer 21 is formed by implanting impurity ions into the silicon substrate 11 in a self-aligned manner, with the stacked gate part as a mask.

In addition, as shown in FIG. 11(b), stacked structures (gate parts) each comprised of the tunnel oxide film 12, silicon nitride film 13, alumina 14, and phosphorus-doped polycrystalline silicon film 15 are formed in the row direction. The stacked structures are separated from one another with a device isolation insulating layer 22 with an STI (Shallow Trench Isolation) structure. The device isolation insulating layer 22 fills a slit-like trench having a depth from the underside of the phosphorus-doped polycrystalline silicon film 15 to the silicon substrate 11.

In the structure, the charge storage layer is comprised of a silicon nitride film and has a low potential barrier to electrons at the interface with the block insulating film (alumina). Therefore, with the memory cell structure of the reference example, the electron capture efficiency is low.

Moreover, since the charge storage layer is comprised of a single-layer silicon nitride film, it is difficult to physically separate the electron trapping position and the hole trapping position from each other. Consequently, when the memory cell of the reference example is miniaturized, the writing/erasing efficiency decreases. In addition, the retention time gets worse and varies more greatly.

3. Embodiments

(1) First Embodiment

Figure 12:
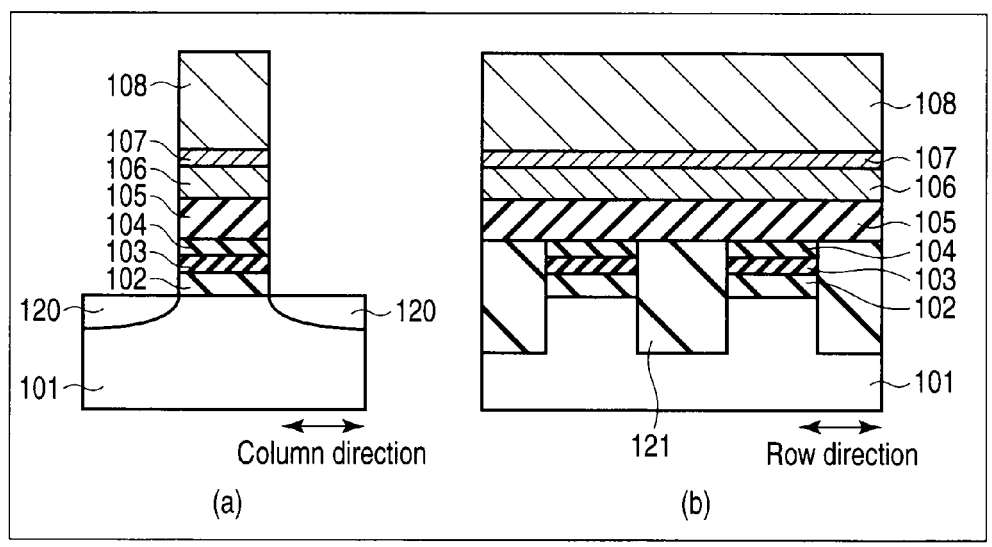

FIG. 12 shows a memory cell of a first embodiment of the invention. FIG. 12(a) is a sectional view taken in the channel length direction and FIG. 12(b) is a sectional view taken in the channel width direction. FIG. 13 shows the configuration of FIG. 12(a) in detail.

At the surface of a p-type silicon substrate (including a well) 101, two source/drain diffusion layers 120 are arranged separately. A part between the source/drain diffusion layers 120 is a channel region. When the memory cell goes into an ON state, a channel which is to electrically conduct the two source/drain diffusion layers 120 is formed in the channel region.

On the channel region, for example, a 5-nm-thick silicon oxynitride film (SiON) 102 is arranged as a first insulating film (tunnel insulating film). The average composition of the silicon oxynitride film is, for example, $(SiO_2)_{0.8}(Si_3N_4)_{0.2}$. On the first insulating film 102, a 3-nm-thick silicon nitride film $(Si_3N_4)$ 103 and a 3-nm-thick tantalum oxide film $(Ta_2O_5)$ 104 are arranged in that order as a charge storage layer.

On the tantalum oxide charge storage layer 104, for example, a 8-nm-thick alumina film 105 is arranged as a second insulating film (block insulating film).

On the second insulating film 105, a control gate electrode 106 comprised of, for example, a tantalum nitride film (TaN) is arranged. On the control gate electrode 106, for example, a tungsten nitride (WN) film 107 is arranged as a barrier metal. On the tungsten nitride film 107, a low-resistance metal film 108 made of tungsten (W) is arranged.

Structures each comprised of the first insulating film (tunnel insulating film) 102 and charge storage layers 103, 104 are formed in the row direction. These structures are separated from one another with STI (Shallow Trench Isolation)-structure device isolation insulating layers 121. The individual layers (105, 106, 107, 108) provided on and above the charge storage layers 103, 104 extend in the row direction. That is, the individual conductive layers (106, 107, 108) extending in the row direction as a whole comprise a word line.

Here, it is desirable that the film thickness of the first insulating film (tunnel insulating film) 102 used in the first embodiment be about 2 to 8 nm. A silicon oxynitride film has been used as the first insulating film (tunnel insulating film) 102 in this embodiment. It is desirable for the average composition of the silicon oxynitride film to satisfy the expression $0.75 < x < 1$ in the composition formula $(SiO_2)_x(Si_3N_4)_{1-x}$ from the viewpoint of reducing defects in the film.

Of course, a silicon oxide film ($SiO_2$) corresponding to an ultimate composition of x=1 may be used as the first insulating film, as well. Since use of a silicon oxynitride film as the first insulating film (tunnel insulating film) decreases the potential barrier to holes, this produces the effect of speeding up the erase operation of the memory cell.

Similarly, when a stacked tunnel insulating film, such as a silicon oxide film/silicon nitride film/silicon oxide film (ONO tunnel insulating film), is used as the first insulating film, this produces the effect of speeding up the erase operation. For example, the film thicknesses of the individual layers of the ONO tunnel insulating film may be set to 1.5 nm, 2.0 nm, and 2.5 nm, starting from the Si substrate, and a set of these films may be used as the first insulting film (tunnel insulating film).

The film thickness of a silicon nitride film serving as the lower part 103 of the charge storage layer used in the first embodiment is preferably about 1 to 5 nm. The silicon nitride film is not necessarily $Si_3N_4$ having a stoichiometric composition and may have a Si-rich composition to increase the trap density in the film or a nitrogen-rich composition to deepen the trap level.

Furthermore, the silicon nitride film serving as the lower part 103 of the charge storage layer may contain a certain amount of oxygen. In addition, the silicon nitride film does not necessarily have a uniform composition. Its composition may vary in the film thickness direction.

The film thickness of a tantalum oxide film serving as the upper part 104 of the charge storage layer used in the first embodiment is preferably about 1 to 5 nm. The tantalum oxide film is not necessarily $Ta_2O_5$ having a stoichiometric composition and may have a Ta-rich composition to increase the trap density in the film. The tantalum oxide film serving as the upper part 104 of the charge storage layer does not necessarily have a uniform composition. Its composition may vary in the film thickness direction.

Moreover, the film thickness of alumina acting as the second insulating film (block insulating film) 105 used in the first embodiment is preferably about 5 to 20 nm. To reduce defects in the film, the alumina serving as the second insulating film may contain a little nitrogen in the film. The second insulating film (block insulating film) 105 is not necessarily comprised of a single-layer alumina film and may be comprised of a stacked block insulating film, such as an alumina film/silicon oxide film/alumina film (AOA film). When an AOA film is used, this produces the effect of reducing leakage currents in both a high and a low electric field in the block insulating film at the same time.

The control gate electrode 106 used in the first embodiment has been comprised of a tantalum nitride film. It may be comprised of metal nitride or metal carbide, such as TiN or TaC, or single metal material, such as Mo or Pt. Moreover, not only a semiconductor electrode, such as n$^+$-type polycrystalline silicon or p$^+$-type polycrystalline silicon, but also silicide materials, such as nickel silicide, cobalt silicide, or tantalum silicide, may be used as the control gate electrode 106. When such semiconductor-series material (including silicide) is used as the control gate electrode, attention should be paid to the reactivity with the second insulating film. An ultrathin silicon nitride film serving as a reaction prevention layer may be inserted between the second insulating film and the semiconductor control gate electrode.

Next, a method of manufacturing the memory cell shown in FIGS. 12 and 13 will be explained.

In FIGS. 14 to 18, each of 14(*a*), 15(*a*), 16(*a*), 17(*a*), and 18(*a*) is a sectional view taken in the channel length direction and each of 14(*b*), 15(*b*), 16(*b*), 17(*b*), and 18(*b*) is a sectional view taken in the channel width direction.

First, as shown in FIG. 14, after the surface of a p-type-impurity-doped silicon substrate (including a well) 101 is cleaned, a silicon oxide film of about 5 nm thick is formed by a thermal oxidation method in the temperature range from 800° C. to 1000° C. Then, the silicon oxide film is nitrided by plasma nitriding techniques, thereby forming a silicon oxynitride film 102 as a first insulating film.

Next, a 3-nm-thick silicon nitride film 103 is formed as the lower part of the charge storage layer on the first insulating film 102 in the temperature range from 600° C. to 800° C. by LPCVD (low pressure chemical vapor deposition) using dichlorosilane ($SiH_2Cl_2$) and ammonia ($NH_3$) as raw material gases.

Next, a tantalum oxide ($Ta_2O_5$) film 104 of about 3 nm thick is formed as the upper part of the charge storage layer in the temperature range, for example, from 400° C. to 500° C. by MOCVD (metal organic chemical vapor deposition) using $(Ta(OC_2H_5)_5)$ and $O_2$ as raw materials.

Then, on the tantalum oxide film 104, a mask material 131 for processing a device isolation region is formed. On the mask material 131, a photoresist is formed. The photoresist is exposed and developed. Then, by RIE (reactive ion etching), a pattern of the photoresist is transferred to the mask material 131. Thereafter, the photoresist is removed.

In this state, with the mask material 131 as a mask, the upper part 104 of the charge storage layer, the lower part 103 of the charge storage layer, and the first insulating film (tunnel insulating film) 102 are etched sequentially by RIE, thereby forming a slit 141a that is to separate memory cells adjacent in the row direction from each other.

Furthermore, the silicon substrate 101 is etched by RIE, thereby forming a device isolating trench 141b with a depth of about 150 nm in the silicon substrate 101.

Figure 15:
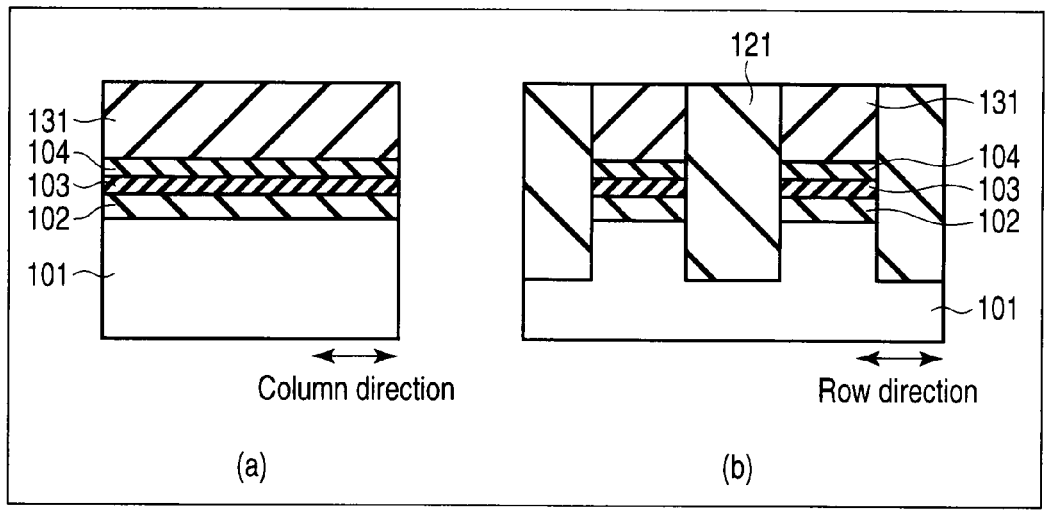

Next, as shown in FIG. 15, a silicon oxide film (buried oxide film) 121 with which the slit 141a and device isolating trench 141b are to be completely filled is formed. Then, by CMP (Chemical Mechanical Polishing), the silicon oxide film 121 is polished until the mask material 131 is exposed, thereby flattening the surface of the silicon oxide film 121.

Next, the buried oxide film 121 is etched back by wet etching techniques. The etching-back process is performed so that the height of the interface between the mask material 131 and the charge storage layer upper part 104 may be equal to the height of the surface of the buried oxide film 121. Then, the mask material is selectively removed.

Figure 16:
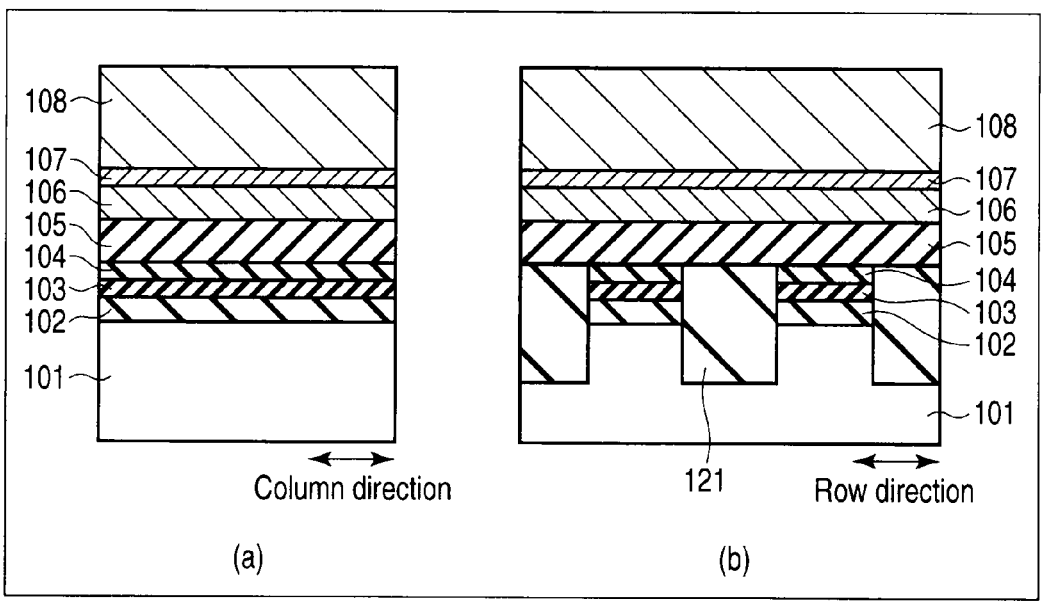

Next, as shown in FIG. 16, an alumina ($Al_2O_3$) film 105 of about 8 nm thick is formed in the temperature range from 200° C. to 400° C. by ALD (atomic layer deposition) using TMA($Al(CH_3)_3$) and $H_2O$ (or $O_3$) as raw materials. Then, on the alumina film 105, tantalum nitride is deposited to a thickness of about 10 nm in the temperature range, for example, from 350° C. to 500° C. to form a control gate electrode 106 by CVD using $Ta(N(CH_3)_2)_5$ as a raw material gas. Next, a tungsten nitride film 107 is deposited to a thickness of about 5 nm in the temperature range, for example, from 400° C. to 500° C. to form a barrier metal by CVD techniques using $NH_3$ and $W(CO)_6$ as raw material gases. On the barrier metal 107, a low-resistance metal film (word line) 108 of about 50 nm thick made of tungsten is formed in the temperature range, for example, from 400° C. to 500° C. by CVD techniques using W(CO)$_6$ as a raw material gas.

Figure 17:
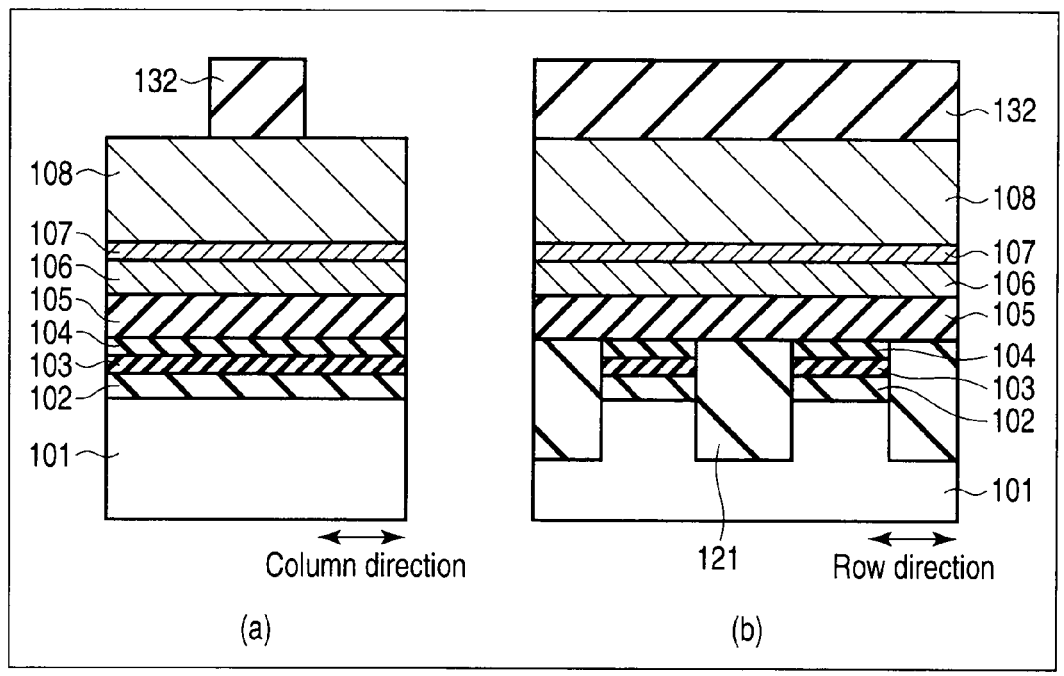

Next, as shown in FIG. 17, on the low-resistance metal film 108, a mask material 132 is formed. On the mask material 132, a photoresist is formed. The photoresist is exposed and developed. Then, by RIE, a pattern of the photoresist is transferred to the mask material 132. Thereafter, the photoresist is removed.

Figure 18:
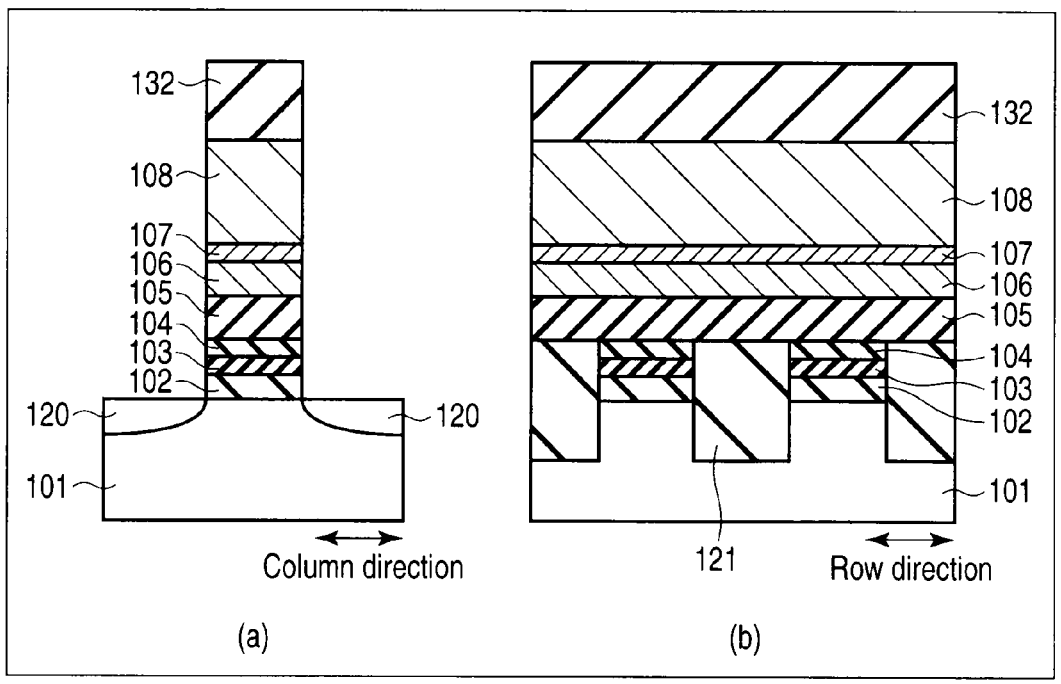

Next, as shown in FIG. 18, with the mask material 132 as a mask, the low-resistance metal film 108, barrier metal 107, control gate electrode 106, second insulating film (block insulating film) 105, the upper part 104 of the charge storage layer, the lower part 103 of the charge storage layer, and first insulating film (tunnel insulating film) 102 are etched sequentially by RIE techniques, thereby forming a MONOS structure.

Then, after a silicon oxide film is formed on the side surface of the MONOS structure by CVD techniques, an n$^+$-type source/drain diffusion layer 120 is formed at the surface of the silicon substrate 101 in a self-aligned manner by ion-implantation, thereby completing a memory cell. Finally, an interlayer insulating film (not shown) which covers the memory cell is formed by CVD techniques.

The above-described manufacturing method is only one example. The memory cell of FIGS. 12 and 13 may be formed by another suitable manufacturing method, as well.

For instance, in the process of forming the first insulating film (tunnel insulating film), various suitable methods, including not only dry O$_2$ oxidation but also wet oxidation (pyrogenic oxidation) and plasma oxidation using O$_2$ or H$_2$O as raw material gases, may be used instead of the thermal oxidation method. Moreover, the process of forming a silicon oxynitride film by nitridation may be replaced with a heat treatment process in an atmosphere of NO gas or NH$_3$ gas in place of nitrogen plasma.

The composition of the silicon nitride film used as the lower part of the charge storage layer may be changed by adjusting the flow ratio of dichlorosilane (SiH$_2$Cl$_2$) to ammonia (NH$_3$) in the raw material gases for LPCVD. Moreover, the composition of the tantalum oxide film used as the upper part of the charge storage layer may be changed by adjusting the ratio of (Ta(OC$_2$H$_5$)$_5$) to O$_2$ in the raw material gases.

In addition, Al$_2$O$_3$ in the second insulating film (block insulating film) may be formed not only by ALD but also MOCVD (metal organic chemical vapor deposition) using TMA(Al(CH$_3$)$_3$) and H$_2$O as raw material gases in the temperature range from 500° C. to 800° C.

The tantalum nitride used as the control gate electrode may be formed not only by MOCVD but also by ALD using Ta(N(CH$_3$)$_2$)$_5$ and NH$_3$ as raw material gases in the temperature range from 200° C. to 400° C.

Furthermore, in forming the individual films constituting the MONOS structure, the raw material gases used in the CVD (or ALD) may be replaced with other suitable gases. The CVD techniques may be replaced with sputtering techniques. The films of the individual layers may be formed not only by CVD or sputtering techniques but also by vapor deposition techniques, a laser ablation method, MBE techniques, or a combination of these techniques.

Figure 19:
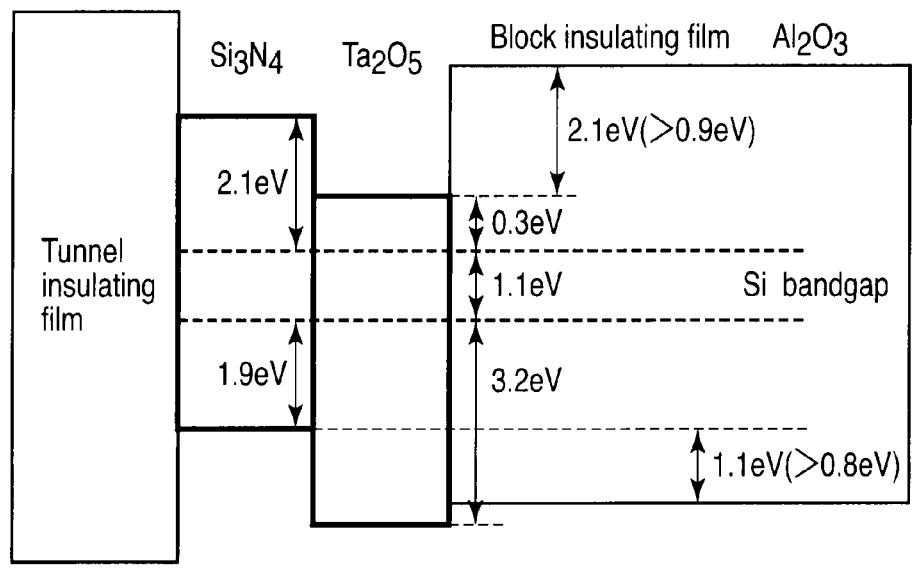
FIG. 19 is a diagram to help explain the energy band structure of a memory cell of the first embodiment.

FIG. 19 is an energy band diagram of the MONOS structure of the first embodiment. As seen from FIG. 19, both the conduction band offset and the valence band offset of the tantalum oxide film in the upper part of the charge storage layer are lower than those of the silicon nitride film in the lower part of the charge storage layer, constituting a "p-n junction-type" stacked insulating film.

The difference between the lowest energy level at the conduction band edge of the charge storage layer (upper part and lower part) and the energy level at the conduction band edge of the block insulating film is 2.1 eV. Since the relative permittivity of the alumina film serving as the block insulating film is about 11, the requirement for the potential barrier to electrons shown in equation (10) is 0.9 eV.

Since in the first embodiment, the potential barrier to electrons higher than that in equation (10) has been obtained, a good electron capture efficiency higher than 90% is obtained in an operating electric field of the MONOS structure.

The difference between the highest energy level (the lowest energy level for holes) at the valence band edge of the charge storage layer (upper part and lower part) and the energy level at the valence band edge of the block insulating film is 1.1 eV. The requirement for the potential barrier to holes derived from equation (11) is 0.8 eV, provided that the relative permittivity of the alumina film is about 11.

Accordingly, since in the first embodiment a potential barrier to holes higher than that in equation (11) has been obtained, a good hole capture efficiency higher than 90% is obtained in an operating electric field of the MONOS structure.

For the reasons stated above, it is seen that the MONOS structure of the first embodiment satisfies the requirements of the invention. Accordingly, as has been discussed under the heading of "Principle of the invention," MONOS memory cells which are superior in the write/erase characteristic, endurance characteristic, and retention characteristic can be realized even after being miniaturized.

As a note, the definitions of the terms and the references of the band profiles of the individual materials used in the first embodiment will be given here. "Conduction band offset" means the energy up to the conduction band edge of the target insulating film, with the conduction band edge energy level of an Si substrate as a reference. "Valence band offset" means (the absolute value of) energy up to the valence band edge of the target insulating film, with the valence band edge energy of an Si substrate as a reference. Both cases are based on the premise of a "flat band state" where no electric field is externally applied.

Next, the references of the band profiles of the individual materials will be described.

A 2.1-eV conduction band offset and a 1.9-eV valence band offset in a silicon nitride film have been covered in, for example, Y. C. Yeo, Q. Lu, W. C. Lee, T. -J. King, C. Hu, X. Wang, X. Guo, T. P. Ma, "Direct Tunneling Gate Leakage Current in Transistors with Ultrathin Silicon Nitride Gate Dielectric," IEEE Electron Device Lett. 21, 540 (2000).

A 0.3-eV conduction band offset and a 3.2-eV valance band offset in tantalum oxide have been covered in, for example, S. Miyazaki, "Photoemission study of energy-band alignments and gap-state density distributions for high-k gate dielectrics," J. Vac. Sci. Technol. B 19, 2212 (2001).

A 2.4-eV conduction band offset and a 3.0-eV valence band offset in alumina have been considered as follows. Although several alumina band profiles have been reported, calculations done by the inventor of the invention on the current-voltage characteristic of the capacitor of an alumina film (single layer) have shown that the resulting conduction barrier height is at 2.4 eV.

As an example giving a conduction band offset closest to this, for example, the values of the conduction band offset and valence band offset in alumina have been used which have been reported in, for example, H. Y. Yu, M. F. Li, B. J. Cho, C. C. Yeo, M. S. Joo, D.-L. Kwong, J. S. Pan, C. H. Ang, J. Z.

Zheng, and S. Ramanathan, "Energy gap and band alignment for $(HfO_2)_x(Al_2O_3)_{1-x}$ on (100) Si," Appl. Phys. Lett. 81, 376 (2002).

(2) Second Embodiment

Figure 20:
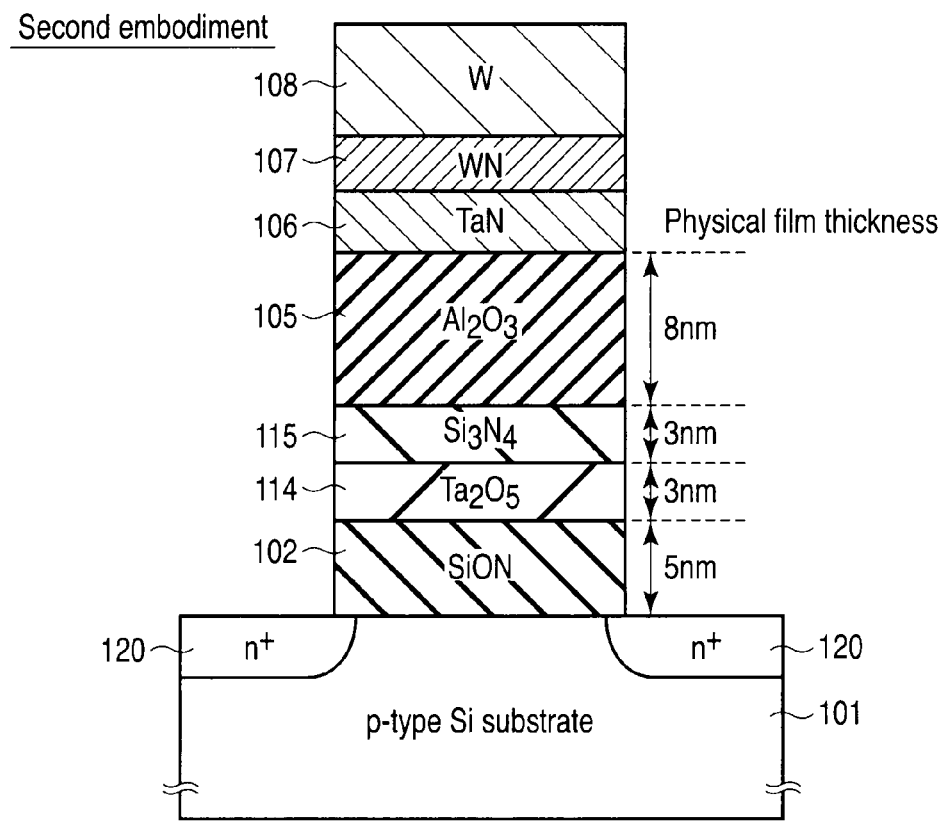
FIG. 20 is a sectional view showing the structure of a memory cell according to a second embodiment.

FIG. 20 is a sectional view of a memory cell according to a second embodiment of the invention taken in the channel length direction. In FIG. 20, the same parts as those in FIG. 12 are indicated by the same reference numerals and a detailed explanation of them will be omitted.

The second embodiment differs from the first embodiment in that the order in which the tantalum oxide film and silicon nitride film are provided in the upper part and lower part of the charge storage layer, respectively, is reversed. In the configuration of the second embodiment, the tantalum oxide film which provides a main charge capture site in writing is located adjacent to the tunnel insulating film, achieving a higher write rate. Thus, the second embodiment has the advantage of easily securing a sufficient threshold voltage shift in a write operation.

At the surface of a p-type silicon substrate (including a well) 101, two source/drain diffusion layers 120 are arranged separately. On a channel region between the source/drain diffusion layers 120, for example, a 5-nm-thick silicon oxynitride film (SiON) 102 is arranged as a first insulating film (tunnel insulating film). On the first insulating film 102, for example, a 3-nm-thick tantalum oxide film ($Ta_2O_5$) 114 is arranged as the lower part of the charge storage layer. On the tantalum oxide film 114, for example, a 3-nm-thick silicon nitride film ($Si_3N_4$) 115 is arranged as the upper part of the charge storage layer.

Then, on the upper part 115 of the charge storage layer, for example, an 8-nm-thick alumina film ($Al_2O_3$) 105 is arranged as a second insulating film (block insulating film). On the second insulating film 105, a control gate electrode 106 made of, for example, tantalum nitride is arranged. On the control gate electrode 106, barrier metal 107 made of, for example, tungsten nitride (WN) is arranged. On the barrier metal 107, a low-resistance metal film 108 made of tungsten (W) is arranged.

The first insulating film (tunnel insulating film) 102, charge storage layers 114, 115, and control gate electrode 106 used in the second embodiment may be modified as in the first embodiment.

A method of manufacturing the memory cell of FIG. 20 is such that the order in which the lower part and upper part of the charge storage layer are formed is reversed from that in the first embodiment. Therefore, a detailed explanation of the method will be omitted.

Figure 21:
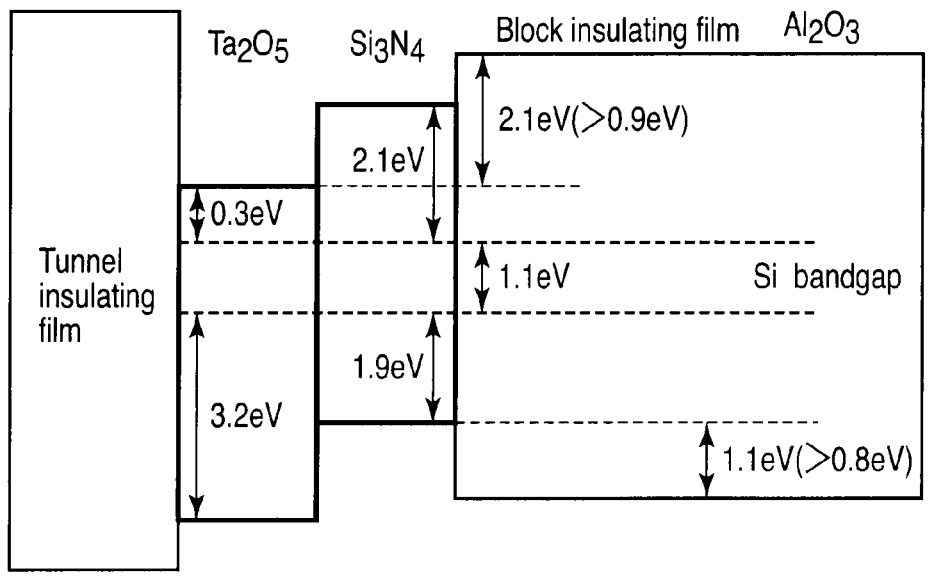
FIG. 21 is a diagram to help explain an energy band structure of the memory cell of the second embodiment.

FIG. 21 is an energy band diagram of the MONOS structure of the second embodiment. As seen from FIG. 21, both the conduction band offset and the valence band offset in the tantalum oxide film in the lower part of the charge storage layer are at lower energy levels than those in the silicon nitride film in the upper part of the charge storage layer, constituting a "p-n junction" type stacked insulating film.

The difference between the lowest energy level at the conduction band edge of the charge storage layer (upper part and lower part) and the energy level at the conduction band edge of the block insulating film is 2.1 eV. The difference is higher than the requirement for the potential barrier to electrons shown in equation (10).

The difference between the highest energy level (the lowest energy level for holes) at the valence band edge of the charge storage layer (upper part and lower part) and the energy level at the valence band edge of the block insulating film is 1.1 eV. The difference is higher than the requirement for the potential barrier to holes shown in equation (11).

For the reasons stated above, it is seen that the energy band structure of the charge storage layer with the MONOS structure satisfies the requirements of the invention. Accordingly, as has been discussed under the heading of "Principle of the invention," MONOS memory cells which are superior in both the write/erase characteristic and retention characteristic can be realized even after having been miniaturized.

(3) Third Embodiment

Figure 22:
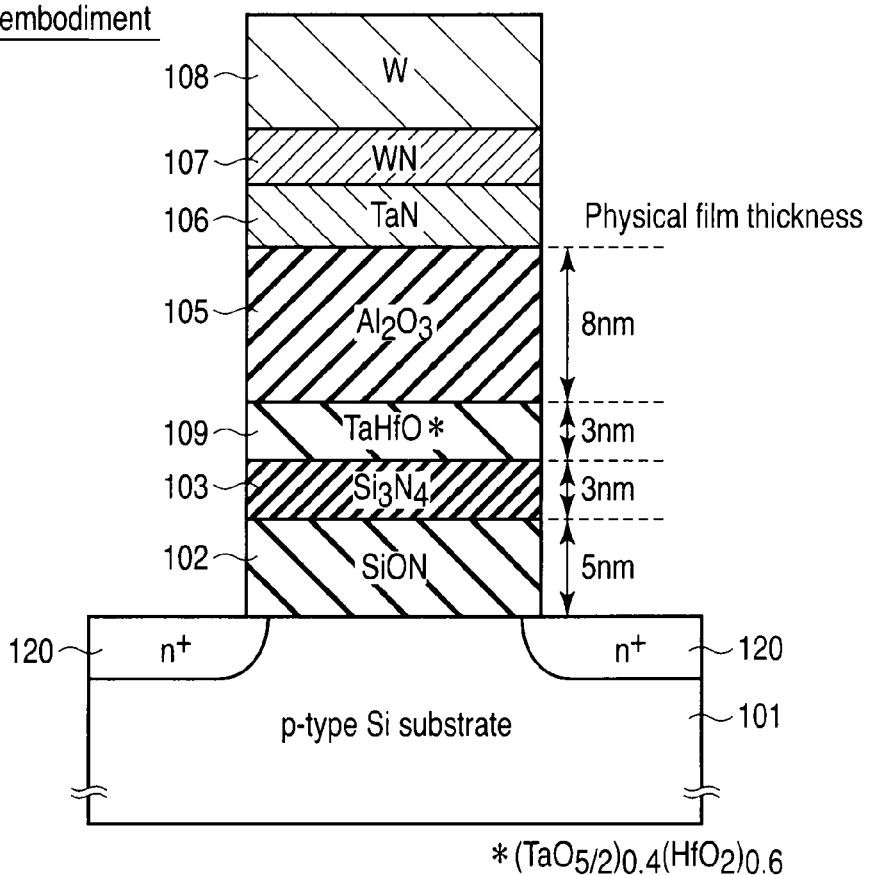
FIG. 22 is a sectional view showing the structure of a memory cell according to a third embodiment.

FIG. 22 is a sectional view of a memory cell according to a third embodiment of the invention taken in the channel length direction. In FIG. 22, the same parts as those in FIG. 12 are indicated by the same reference numerals and a detailed explanation of them will be omitted.

The third embodiment differs from the first embodiment in that a TaHfO film is used in the upper part of the charge storage layer. As has been described in, for example, M. H. Zhang, S. J. Rhee, C. Y. Kang, C. H. Choi, M. S. Akbar, S. A. Krishnan, T. Lee, I. J. Ok, F. Zhu, H. S. Kim, and J. C. Lee, "Improved electrical and material characteristics of HfTaO gate dielectrics with high crystallization temperature," Appl. Phys. Lett. 87, 232901 (2005), TaHfO insulating films have the characteristics of a high crystallization temperature and a high transistor mobility. These properties are useful in offering resistance to high temperatures in the manufacturing processes and realizing high-performance MONOS memory cells.

At the surface of a p-type silicon substrate (including a well) 101, two source/drain diffusion layers 120 are arranged separately. On a channel region between the source/drain diffusion layers 120, for example, a 5-nm-thick silicon oxynitride film (SiON) 102 is arranged as a first insulating film (tunnel insulating film). On the first insulating film 102, for example, a 3-nm-thick silicon nitride film ($Si_3N_4$) 103 is arranged as the lower part of the charge storage layer. On the lower part 103 of the charge storage layer, for example, a TaHfO film of about 3 nm thick is arranged as the upper part 109 of the charge storage layer. The composition of the TaHfO film is preferably [Hf]/[Ta]=0.6/0.4 at which the crystallization temperature becomes highest, that is, $(TaO_{5/2})_{0.4}(HfO_2)_{0.6}$, or a composition in its vicinity.

On the upper part 109 of the charge storage layer, for example, an alumina film 105 of about 8 nm thick is arranged as a second insulating film (block insulating film).

On the second insulating film 105, a control gate electrode 106 comprised of, for example, a tantalum nitride film is arranged. On the control gate electrode 106, barrier metal 107 made of, for example, tungsten nitride (WN) is arranged. On the barrier metal 107, a low-resistance metal film 108 made of tungsten (W) is arranged.

The configuration of the first insulating film (tunnel insulating film) 102, charge storage layers 103, 109, and control gate electrode 106 used in the third embodiment may be modified as in the first embodiment.

A method of manufacturing the memory cell of FIG. 22 is almost the same as that in the first embodiment, except for the process of forming a TaHfO film in the upper part of the charge storage layer. The process can be carried out using ALD with $HfCl_4$, $TaCl_5$, and $H_2O$ as raw material gases in the temperature range, for example, from 200° C. to 400° C. The TaHfO composition ratio can be adjusted by changing the cycle ratio of $HfCl_4$ to $TaCl_5$. This manufacturing method is only one example. The memory cell may be formed by another suitable manufacturing method, as well.

Next, the energy band diagram of the MONOS memory cell of the third embodiment will be examined. First, the evaluation of a band diagram using XPS (X-ray photoelectron spectroscopy) will be described.

As described in, for example, S. Maikap, T.-Y. Wang, P.-J, Tzeng, C.-H. Lin, T. C. Tien, L. S. Lee, J.-R. Yang, M.-J. Tsai, "Band offsets and charge storage characteristics of atomic layer deposited high-k $HfO_2/TiO_2$ multilayers," Appl. Phys. Lett. 90, 262901 (2007), $HfO_2$ has a 1.7-eV conduction band offset and a 3.1-eV valence band offset. Since the valence band offset of $HfO_2$ depends on the annealing condition, the evaluated value should be adopted after post-deposition annealing as described in the above document.

With reference to the aforementioned S. Miyazaki, "Photoemission study of energy-band alignments and gap-state density distributions for high-k gate dielectrics," J. Vac. Sci. Technol. B 19, 2212 (2001), $Ta_2O_5$ has a 0.3-eV conduction band offset and a 3.2-eV valence band offset.

Furthermore, according to, for example, V. V. Afanas' ev, A. Stesmans, C. Zhao, M. Caymax, Z. M. Rittersma, J. M. Maes, "Band alignment at the interface of (100)Si with $Hf_xTa_{1-x}O_y$ high-k dielectric layers," Appl. Phys. Lett. 86, 072108 (2005), it has been reported that the band offset of a TaHfO insulating film varies continuously with the film composition.

From what has been described above, when the composition of the TaHfO insulating film is expressed as $(TaO_{5/2})_y(HfO_2)_{1-y}$, the conduction band offset and valence band offset in the TaHfO insulating film can be formulated as follows:

$$\Delta E_c = 0.3y + 1.7(1-y) \quad (12)$$

$$\Delta E_v = 3.2y + 3.1(1-y) \quad (13)$$

Here, consider a case where an alumina film whose relative permittivity is 11 (with a conduction band offset of 2.4 eV) is used as the block insulating film. From equation (10), it is necessary to form a potential barrier not lower than 0.9 eV between the charge storage layer and the block insulating film. To do this, $\Delta E_C$ in equation (12) has to be made equal to or lower than 1.5 eV.

The composition range of a TaHfO insulating film to satisfy the condition is represented by the following expression:

$$0.14 < y < 1 \quad (14)$$

Specifically, when the block insulating film is alumina, the composition of a TaHfO insulating film used in the third embodiment is limited to the range represented by expression (14). Since y=0.4 in the third embodiment, the composition of the TaHfO insulating film of the third embodiment is included in the range of expression (14).

Since the energy band structure is determined by the mole fraction of a metal element, the requirement of the invention is represented as described above. Furthermore, it is expressed in the mole fraction of each of the elemental materials as follows. When the mole fraction of a TaHfO insulating film is represented as $(HfO_2)_x(Ta_2O_5)_{1-x}$, the relationship between fractions x and y is expressed as:

$$y = \frac{2-2x}{2-x} \quad (15)$$

Accordingly, the requirement of the invention expressed as $0.14 < y < 1$ corresponds to $0 < x < 0.92$.

That is, when the composition of the TaHfO insulating film is expressed as $(HfO_2)_x(Ta_2O_5)_{1-x}$, it should be used in the range of $0 < x < 0.92$.

Figure 23:
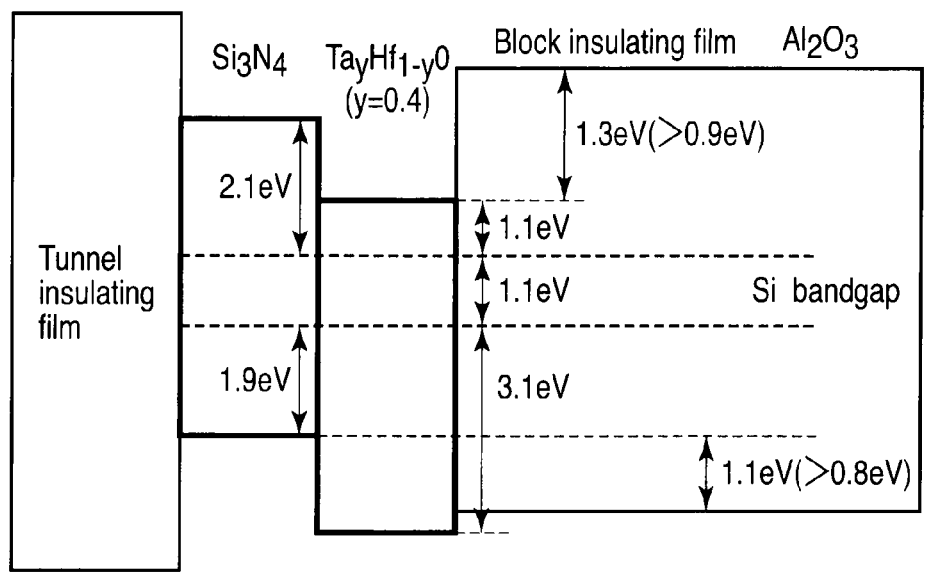
FIG. 23 is a diagram to help explain an energy band structure of the memory cell of the third embodiment.

FIG. 23 is an energy band diagram of the MONOS structure of the third embodiment.

The TaHfO insulating film (y=0.4) of the third embodiment has a 1.1-eV conduction band offset and a 3.1-eV valence band offset. As seen from FIG. 23, both the conduction band offset and the valence band offset in the TaHfO insulating film in the upper part of the charge storage layer are lower than those in the silicon nitride film in the lower part of the charge storage layer, constituting a "p-n junction" type stacked insulating film.

The difference between the lowest energy level at the conduction band edge of the charge storage layer (upper part and lower part) and the energy level at the conduction band edge of the block insulating film is 1.3 eV. The difference is not lower than the potential barrier difference shown in equation (10).

The difference between the highest energy level (the lowest energy level for holes) at the valence band edge of the charge storage layer (upper part and lower part) and the energy level at the valence band edge of the block insulating film is 1.1 eV. The difference is not lower than the potential barrier difference shown in equation (11).

For the reasons stated above, it is seen that the energy band structure of the charge storage layer with the MONOS structure satisfies the requirements of the invention. Accordingly, as has been discussed under the heading of "Principle of the invention," reliable MONOS memory cells which are superior in both the write/erase characteristic and retention characteristic can be realized even after having been miniaturized.

(4) Fourth Embodiment

Figure 24:
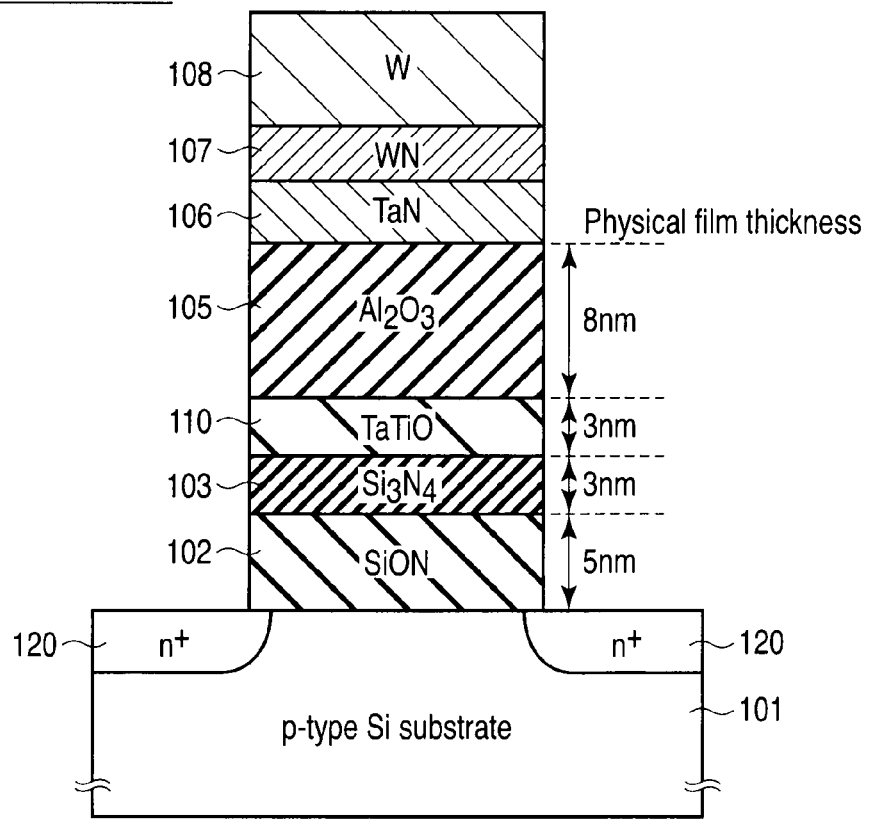
FIG. 24 is a sectional view showing the structure of a memory cell according to a fourth embodiment.

FIG. 24 is a sectional view of a memory cell according to a fourth embodiment of the invention taken in the channel length direction. In FIG. 24, the same parts as those in FIG. 12 are indicated by the same reference numerals and a detailed explanation of them will be omitted.

The fourth embodiment differs from the first embodiment in that a TaTiO film is used in the upper part of the charge storage layer.

For example, as has been reported in J.-Y. Gan, Y. C. Chang, and T. B. Wu, "Dielectric property of $(TiO_2)_x$—$(Ta_2O_5)_{1-x}$ thin films," Appl. Phys. Lett. 72, 332 (1998)), it is known that adding a trace of $TiO_2$ to $Ta_2O_5$ causes the permittivity to increase sharply. This effect is most obvious when the mole fraction of $TiO_2$ is about 8%. When such a TaTiO film is used as a part of the MONOS memory cell charge storage layer which satisfies the requirements of the invention, the EOT (equivalent oxide thickness) of the memory cell can be decreased.

Accordingly, use of a TaTiO film as an example of the invention contributes to a decrease in the power supply voltage of the memory cell, a lowered memory cell power consumption, and an increase in the reliability of the memory cell.

At the surface of a p-type silicon substrate (including a well) 101, two source/drain diffusion layers 120 are arranged separately. On a channel region between the source/drain diffusion layers 120, for example, a 5-nm-thick silicon oxynitride film (SiON) 102 is arranged as a first insulating film (tunnel insulating film). On the first insulating film 102, for example, a 3-nm-thick silicon nitride film ($Si_3N_4$) 103 is arranged as the lower part of the charge storage layer.

On the lower part 103 of the charge storage layer, for example, a TaTiO film of about 3 nm thick is arranged as the upper part 110 of the charge storage layer. In the fourth embodiment, the $TiO_2$ mole fraction is set at 8% in $(TiO_2)_x$ $(Ta_2O_5)_{1-x}$. With reference to J.-Y. Gan, Y. C. Chang, and T. B. Wu, "Dielectric property of $(TiO_2)_x$—$(Ta_2O_5)_{1-x}$ thin films," Appl. Phys. Lett. 72, 332 (1998)) described above and K. M. A. Salam, H. Fukuda, and S, Nomura, "Effects of additive elements on improvement of the dielectric properties of $Ta_2O_5$ films formed by metalorganic decomposition," J. Appl. Phys. 93, 1169 (2003), the composition of the TaTiO film is preferably in the vicinity of a composition that makes the permittivity the highest. Such a composition range corresponds to the range of x=about 0.04 to 0.12 in $(TiO_2)_x(Ta_2O_5)_{1-x}$.

On the upper part 110 of the charge storage layer, an alumina film 105 of about 8 nm thick is arranged as a second insulating film (block insulating film).

On the second insulating film 105, a control gate electrode 106 comprised of, for example, a tantalum nitride film is arranged. On the control gate electrode 106, barrier metal 107 made of, for example, tungsten nitride (WN) is arranged. On the barrier metal 107, a low-resistance metal film 108 made of tungsten (W) is arranged.

The configuration of the first insulating film (tunnel insulating film) 102, charge storage layers 103, 110, and control gate electrode 106 used in the fourth embodiment may be modified as in the first embodiment.

A method of manufacturing the memory cell of FIG. 24 is almost the same as that in the first embodiment, except for the process of forming a TaTiO film in the upper part of the charge storage layer. The process can be carried out using ALD with $TiCl_4$, $TaCl_5$, and $H_2O$ as raw material gases in the temperature range, for example, from 200° C. to 400° C. The TaTiO composition ratio can be adjusted by changing the cycle ratio of $TiCl_4$ to $TaCl_5$. This manufacturing method is only one example. The memory cell may be formed by another suitable manufacturing method, as well.

Next, the energy band diagram of the MONOS memory cell of the fourth embodiment will be examined.

First, as described in, for example, S. Maikap, T.-Y. Wang, P.-J, Tzeng, C.-H. Lin, T. C. Tien, L. S. Lee, J.-R. Yang, M.-J. Tsai, "Band offsets and charge storage characteristics of atomic layer deposited high-k $HfO_2/TiO_2$ multilayers," Appl. Phys. Lett. 90, 262901 (2007), $TiO_2$ has a 0.9-eV conduction band offset and a 1.5-eV valence band offset.

In the case of the TaTiO insulating film, it can also be assumed that the conduction band offset and valence band offset vary continuously with the film composition. Under this assumption, the conduction band offset and valence band offset can be formulated as follows:

$$\Delta E_c = 0.3y + 0.9(1-y) \quad (16)$$

$$\Delta E_v = 3.2y + 1.5(1-y) \quad (17)$$

Here, when the composition of the TaTiO insulating film is expressed as $(TaO_{5/2})_y(TiO_2)_{1-y}$, variable y represents the composition ratio. The relationship between composition variables x and y will be described later.

In the fourth embodiment, alumina has been used as the block insulating film. In this case, from equation (16) and equation (17), it is seen that the requirement of the invention for the potential barrier between the charge storage layer and block insulating film is always fulfilled, regardless of the composition of the TaTiO film. The condition for the potential barrier is fulfilled between the TaTiO film and the alumina film on the conduction band side and between the silicon nitride film and the alumina on the valence band side.

On the other hand, whether a "p-n junction" type stacked insulating film has been realized, which is the other requirement of the invention, depends on the film composition of the TaTiO film. As seen from equation (16), the conduction band offset of the TaTiO insulating film is always smaller than the conduction band offset of the silicon nitride film. Accordingly, to realize a "p-n junction" type stacked insulating film, the valence band offset of the TaTiO insulating film has to be larger than the valence band offset of the silicon nitride film. When $\Delta E_v > 1.9$ eV in equation (17), its condition is expressed as:

$$0.24 < y < 1 \quad (18)$$

That is, to satisfy the requirement of the invention, the Ta atom ratio in the TaTiO insulating film has to be kept in the range represented by expression (18).

Since the energy band structure is determined by the mole fraction of a metal element, the requirement of the invention is represented as described above. Furthermore, it is expressed in the mole fraction of each of the elemental materials as follows. When the mole fraction of $TiO_2$ in the TaTiO insulating film is x and the composition of the TaTiO insulating film is represented as $(TiO_2)_x(Ta_2O_5)_{1-x}$, the relationship between fractions x and y is expressed as:

$$y = \frac{2-2x}{2-x} \quad (19)$$

Therefore, the condition expressed as $0.24 < y < 1$ corresponds to:

$$0 < x < 0.87 \quad (20)$$

From what has been described above, when the composition of the TaTiO insulating film is expressed as $(TiO_2)_x(Ta_2O_5)_{1-x}$, it should be used in the range represented by expression (20). Since the mole fraction of $TiO_2$ in $(TiO_2)_x(Ta_2O_5)_{1-x}$ is 8%, giving x=0.08, the TaTiO insulating film of the fourth embodiment is in the range represented by expression (20).

Figure 25:
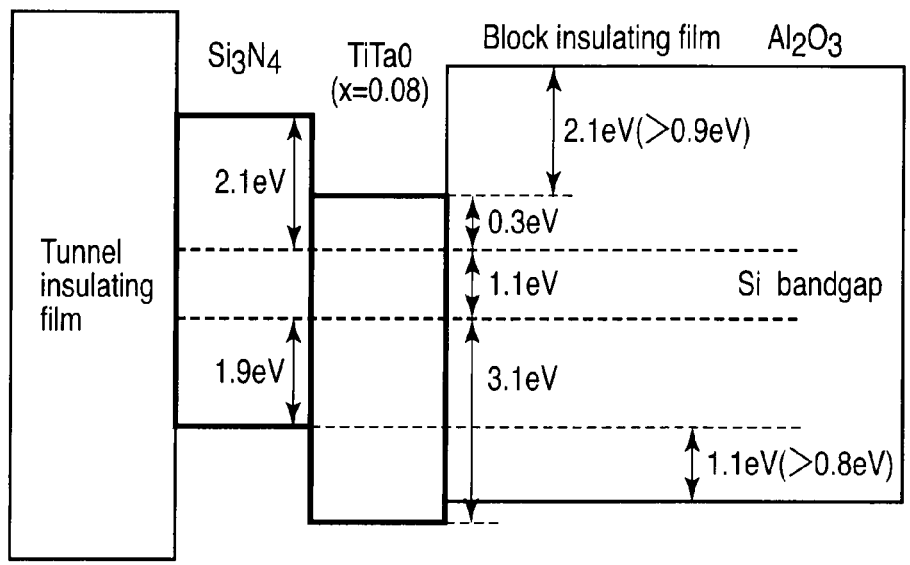
FIG. 25 is a diagram to help explain an energy band structure of the memory cell of the fourth embodiment.

Next, FIG. 25 is an energy band diagram of the MONOS structure of the fourth embodiment.

Although the mole fraction of $TiO_2$ is x=0.08 in the fourth embodiment, use of equation (19) makes x=0.08 correspond to the Ta atom ratio y=0.96. At this time, the conduction band offset and valence band offset of the TaTiO insulating film are about 0.3 eV and 3.1 eV, respectively, from equation (16) and equation (17). FIG. 25 is an energy band diagram based on this result.

As seen from FIG. 25, both the conduction band offset and the valence band offset in the TaTiO insulating film in the upper part of the charge storage layer are lower than those in the silicon nitride film in the lower part of the charge storage layer, constituting a "p-n junction" type stacked insulating film.

The difference between the lowest energy level at the conduction band edge of the charge storage layer (upper part and lower part) and the energy level at the conduction band edge of the block insulating film is 2.1 eV. That is, a potential barrier higher than 0.9 eV obtained from equation (10) is realized on the conduction band side.

The difference between the highest energy level (the lowest energy level for holes) at the valence band edge of the charge storage layer (upper part and lower part) and the energy level at the valence band edge of the block insulating film is 1.1 eV. That is, a potential barrier higher than 0.8 eV obtained from equation (11) is also realized on the valence band side.

For the reasons stated above, it is seen that the MONOS energy band structure of the fourth embodiment satisfies the requirements of the invention. Accordingly, as has been discussed under the heading of "Principle of the invention," reliable MONOS memory cells which are superior in both the write/erase characteristic and retention characteristic can be realized even after having been miniaturized.

(5) Fifth Embodiment

Figure 26:
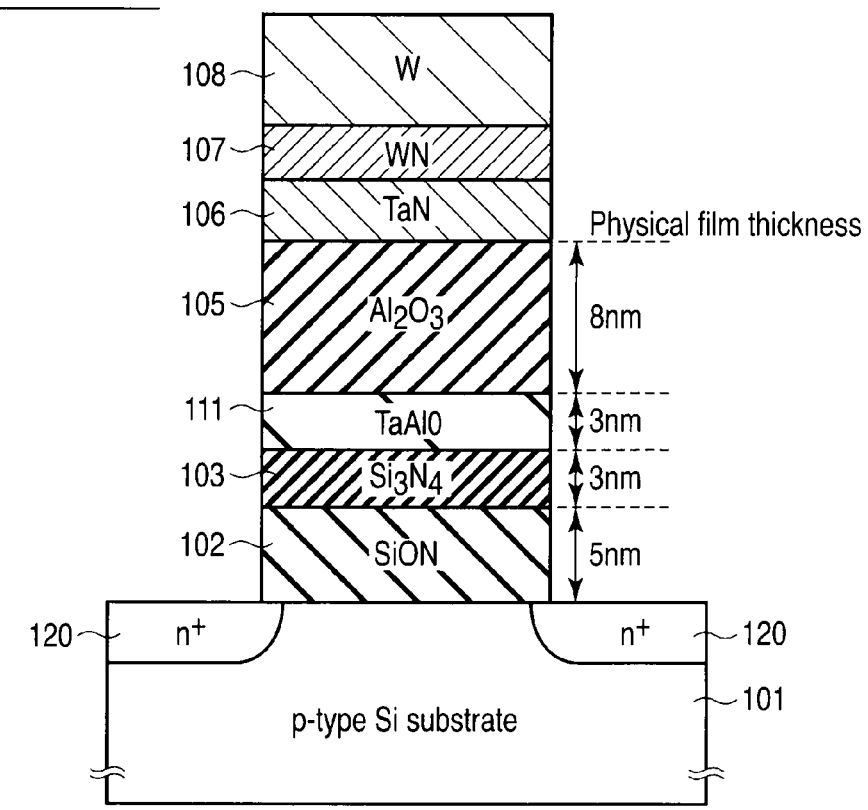
FIG. 26 is a sectional view showing the structure of a memory cell according to a fifth embodiment.

FIG. 26 is a sectional view of a memory cell according to a fifth embodiment of the invention taken in the channel length direction. In FIG. 26, the same parts as those in FIG. 12 are indicated by the same reference numerals and a detailed explanation of them will be omitted.

The fifth embodiment differs from the first embodiment in that a TaAlO film is used in the upper part of the charge storage layer. For example, as has been described in R. J. Cava, W. F. Peck, Jr., J. J. Krajewski, G. L. Roberts, B. P. Barber, H. M. O'Bryan, and P. L. Gammel, "Improvement of the dielectric properties of $Ta_2O_5$ through substitution with $Al_2O_3$," Appl. Phys. Lett. 70, 1396 (1997), adding a trace of $Al_2O_3$ to $Ta_2O_5$ causes not only the permittivity to increase but also the rate of change of the permittivity with temperature to decrease. This effect is most obvious when the mole fraction of $Al_2O_3$ is about 10%.

Use of such a TaAlO film as a part of the charge storage layer of the MONOS memory cell that satisfies the requirement of the invention causes not only the EOT (equivalent oxide thickness) of the memory cell to decrease but also the dependence of device characteristics on temperature to weaken. Accordingly, use of a TaAlO film as a part of the charge storage layer makes it possible to realize a decrease in the power supply voltage of the memory cell, a lowered memory cell power consumption, and an increase in the reliability of the memory cell. Use of a TaAlO film particularly contributes to realizing less temperature-dependent MONOS memory cell characteristics.

At the surface of a p-type silicon substrate (including a well) 101, two source/drain diffusion layers 120 are arranged separately. On a channel region between the source/drain diffusion layers 120, for example, a 5-nm-thick silicon oxynitride film (SiON) 102 is arranged as a first insulating film (tunnel insulating film). On the first insulating film 102, for example, a 3-nm-thick silicon nitride film ($Si_3N_4$) 103 is arranged as the lower part of the charge storage layer.

On the lower part 103 of the charge storage layer, for example, a TaAlO film of about 3 nm thickness is arranged as the upper part 111 of the charge storage layer. In the fifth embodiment, the $Al_2O_5$ mole fraction is set at 10% in $(Al_2O_3)_x(Ta_2O_5)_{1-x}$. With reference to R. J. Cava, W. F. Peck, Jr., J. J. Krajewski, G. L. Roberts, B. P. Barber, H. M. O'Bryan, and P. L. Gammel, "Improvement of the dielectric properties of $Ta_2O_5$ through substitution with $Al_2O_3$," Appl. Phys. Lett. 70, 1396 (1997), the composition of the TaAlO film is preferably in a composition range where the permittivity gets higher and is less temperature-dependent, that is, in the range of x=0.05 to 0.2 in $(Al_2O_3)_x(Ta_2O_5)_{1-x}$.

On the upper part 111 of the charge storage layer, an alumina film 105 of about 8 nm thickness is arranged as a second insulating film (block insulating film).

On the second insulating film 105, a control gate electrode 106 comprised of, for example, a tantalum nitride film is arranged. On the control gate electrode 106, barrier metal 107 made of, for example, tungsten nitride (WN) is arranged. On the barrier metal 107, a low-resistance metal film 108 made of tungsten (W) is arranged.

The configuration of the first insulating film (tunnel insulating film) 102, charge storage layers 103, 111, and control gate electrode 106 used in the fifth embodiment may be modified as in the first embodiment.

A method of manufacturing the memory cell of FIG. 26 is almost the same as that in the first embodiment, except for the process of forming a TaAlO film in the upper part of the charge storage layer. The process can be carried out using ALD with $Al(CH_3)_3$, $TaCl_5$, and $H_2O$ as raw material gases in the temperature range, for example, from 200° C. to 400° C. The TaAlO film composition ratio can be adjusted by changing the cycle ratio of $Al(CH_3)_3$ to $TaCl_5$. This manufacturing method is only one example. The memory cell may be formed by another suitable manufacturing method, as well.

Next, the energy band diagram of the MONOS memory cell of the fifth embodiment will be examined. First, as described in H. Y. Yu, M. F. Li, B. J. Cho, C. C. Yeo, M. S. Joo, D.-L. Kwong, J. S. Pan, C. H. Ang, J. Z. Zheng, and S. Ramanathan, "Energy gap and band alignment for $(HfO_2)_x(Al_2O_3)_{1-x}$ on (100) Si," Appl. Phys. Lett. 81, 376 (2002), $Al_2O_3$ has a 2.4-eV conduction band offset and a 3.0-eV valence band offset. In addition, as described in S. Miyazaki, "Photoemission study of energy-band alignments and gap-state density distributions for high-k gate dielectrics," J. Vac. Sci. Technol. B 19, 2212 (2001), $Ta_2O_5$ has a 0.3-eV conduction band offset and a 3.2-eV valence band offset.

In the case of the TaAlO insulating film, it is also assumed that the conduction band offset and valence band offset vary continuously with the film composition. The conduction band offset and valence band offset can be formulated as follows:

$$\Delta E_c = 0.3y + 2.4(1-y) \tag{21}$$

$$\Delta E_v = 3.2y + 3.0(1-y) \tag{22}$$

Here, variable y represents the composition ratio when the composition of the TaAlO insulating film is expressed as $(TaO_{5/2})_y(AlO_{3/2})_{1-y}$.

In the fifth embodiment, alumina has been used as the block insulating film. In this case, when a silicon nitride film and a TaAlO stacked insulating film are used as the charge storage layer, the condition of the potential barrier, one of the requirements of the invention, is fulfilled on the valance band side. The reason for this is that the difference between the valence band offset of the silicon nitride and that of the alumina is 1.1 eV (>0.8 eV).

On the other hand, as for the conduction band offset, it is necessary to select a composition range where the conduction band offset of the TaAlO film expressed by equation (21) satisfies the expression $\Delta E_C < (2.4-0.9)$ eV.

The condition is represented as:

$$0.43 < y < 1 \tag{23}$$

Specifically, to satisfy the requirement of the invention, it is necessary to keep the Ta atom ratio in the TaAlO insulating film in the range represented by expression (23). When the ratio is in the composition range represented by expression (23), it is seen from equation (21) and equation (22) that the requirement of the "p-n junction" type stacked insulating film, the other requirement of the invention, is always satisfied.

Since the energy band structure is determined by the mole fraction of a metal element, the requirement of the invention is represented as described above. Furthermore, it is expressed in the mole fraction of each of the elemental materials as follows. When the mole fraction of $Al_2O_3$ in the TaAlO insulating film is x and the composition of the TaAlO insulating film is represented as $(Al_2O_3)_x(Ta_2O_5)_{1-x}$, the relationship between fractions x and y is expressed as:

$$y = 1 - x \tag{24}$$

Therefore, the condition expressed as $0.43<y<1$, which is one requirement of the invention, corresponds to:

$$0<x<0.57 \tag{25}$$

Specifically, when the composition of the TaAlO insulating film is expressed as $(Al_2O_3)_x(Ta_2O_5)_{1-x}$ using the mole fraction x of alumina, the composition range represented by expression (25) should be used. Since x=0.1 in the fifth embodiment, the TaAlO insulating film of the fifth embodiment is within the composition range represented by expression (25).

Figure 27:
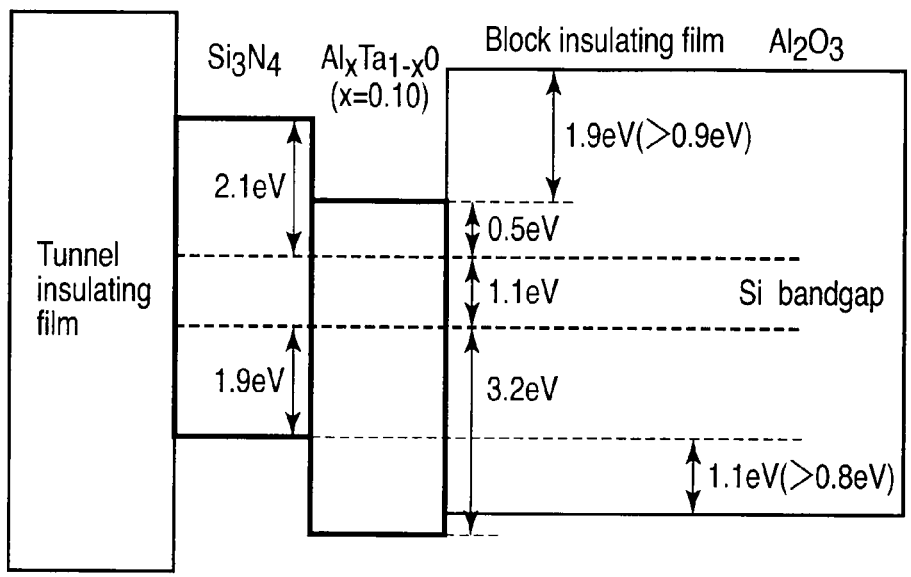
FIG. 27 is a diagram to help explain an energy band structure of the memory cell of the fifth embodiment.

An energy band diagram of the MONOS structure of the fifth embodiment based on the above considerations is shown in FIG. 27.

Although the mole fraction of $Al_2O_3$ is x=0.1 in the fifth embodiment, use of equation (24) makes x=0.1 correspond to the Ta atom ratio of y=0.9. At this time, the conduction band offset and valence band offset of the TaAlO insulating film are about 0.5 eV and 3.2 eV, respectively, from equation (21) and equation (22). FIG. 27 is an energy band diagram based on this result.

As seen from FIG. 27, both the conduction band offset and the valence band offset in the TaAlO insulating film in the upper part of the charge storage layer are lower than those in the silicon nitride film in the lower part of the charge storage layer, constituting a "p-n junction" type stacked insulating film. The difference between the lowest energy level at the conduction band edge of the charge storage layer (upper part and lower part) and the energy level at the conduction band edge of the block insulating film is 1.9 eV, which is higher than a potential barrier of 0.9 eV in equation (10). The difference between the highest energy level (the lowest energy level for holes) at the valence band edge of the charge storage layer (upper part and lower part) and the energy level at the valence band edge of the block insulating film is 1.1 eV, which is higher than a potential barrier of 0.8 eV in equation (11).

For the reasons stated above, it is seen that the MONOS energy band structure of the fifth embodiment satisfies the requirements of the invention. Accordingly, as has been discussed under the heading of "Principle of the invention," reliable MONOS memory cells which are superior in both the write/erase characteristic and retention characteristic can be realized even after having been miniaturized.

(6) Sixth Embodiment

Figure 28:
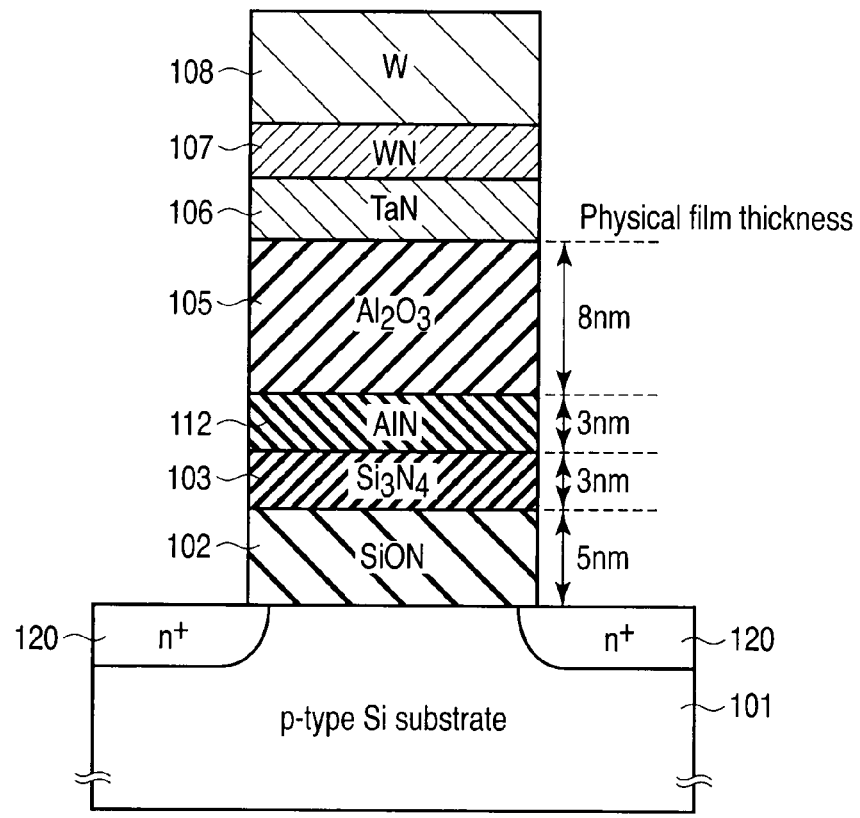
FIG. 28 is a sectional view showing the structure of a memory cell according to a sixth embodiment of the invention.

FIG. 28 is a sectional view of a memory cell according to a sixth embodiment of the invention taken in the channel length direction. In FIG. 28, the same parts as those in FIG. 12 are indicated by the same reference numerals and a detailed explanation of them will be omitted.

The sixth embodiment differs from the first embodiment in that an AlN—GaN insulating film is used in the upper part of the charge storage layer. For example, as has been described in A. Chin, C. C. Laio, C. Chen, K. C. Chiang, D. S. Yu, W. J. Yoo, G. S. Samudra, T. Wang, I. J. Hsieh, S. P. McAlister, and C. C. Chi, "Low Voltage High Speed $SiO_2$/AlGaN/AlLaO_3/TaN Memory with Good Retention," IEDM Tech. Dig. pp. 165-168 (2005), use of an AlN—GaN insulating film makes it possible to form a charge storage layer with a deep conduction band energy level.

In the sixth embodiment, usage of such an AlN—GaN insulating film as a part of the charge storage layer of the MONOS memory cell realizes a good charge capture efficiency and the separation of electron and hole trapping positions at the same time. Consequently, the sixth embodiment, which introduces an AlN—GaN insulating film into a part of the charge storage layer, produces the effect of decreasing the power supply voltage of the memory cell and improving the retention time.

At the surface of a p-type silicon substrate (including a well) 101, two source/drain diffusion layers 120 are arranged separately. On a channel region between the source/drain diffusion layers 120, for example, a 5-nm-thick silicon oxynitride film (SiON) 102 is arranged as a first insulating film (tunnel insulating film). On the first insulating film 102, for example, a 3-nm-thick silicon nitride film ($Si_3N_4$) 103 is arranged as the lower part of the charge storage layer. On the lower part 103 of the charge storage layer, for example, an AlN film of about 3 nm thickness is arranged as the upper part 112 of the charge storage layer. The sixth embodiment corresponds to a case where the mole fraction of AlN is at 100% (x=1) in $(AlN)_x(GaN)_{1-x}$. As described layer, when alumina is used to comprise the block insulating film, the AlN—GaN insulating film of the charge storage layer satisfies the requirements of the invention, regardless of its composition ratio. Accordingly, the insulating film material constituting the upper part of the charge storage layer is not necessarily limited to the AlN film and the composition ratio x can take an arbitrary value in the range of 0 to 1 in $(AlN)_x(GaN)_{1-x}$.

On the upper part 112 of the charge storage layer, an alumina film 105 of about 8 nm thick is arranged as a second insulating film (block insulating film). On the second insulating film 105, a control gate electrode 106 comprised of, for example, a tantalum nitride film is arranged. On the control gate electrode 106, barrier metal 107 made of, for example, tungsten nitride (WN) is arranged. On the barrier metal 107, a low-resistance metal film 108 made of tungsten (W) is arranged.

The configuration of the first insulating film (tunnel insulating film) 102, charge storage layers 103, 112, and control gate electrode 106 used in the sixth embodiment may be modified as in the first embodiment.

A method of manufacturing the memory cell of FIG. 28 is almost the same as that in the first embodiment, except for the process of forming an AlN film in the upper part of the charge storage layer. The process can be carried out using ALD with $Al(CH_3)_3$ and $NH_3$ as raw material gases in the temperature range, for example, from 200° C. to 400° C. This manufacturing method is only one example. The memory cell may be formed by another suitable manufacturing method, as well.

Next, the energy band diagram of the MONOS memory cell of the sixth embodiment will be examined. Although the upper part of the charge storage layer is an AlN film in the sixth embodiment, GaN—AlN insulating films are generally used. Therefore, such a general case will be considered. With reference to A. Chin, C. C. Laio, C. Chen, K. C. Chiang, D. S. Yu, W. J. Yoo, G. S. Samudra, T. Wang, I. J. Hsieh, S. P. McAlister, and C. C. Chi, "Low Voltage High Speed $SiO_2$/AlGaN/AlLaO_3/TaN Memory with Good Retention," IEDM Tech. Dig. pp. 165-168 (2005), AlN has a 1.0-eV conduction band offset and a 3.7-eV valence band offset. In addition, GaN has a conduction band offset of −0.6 eV and a valence band offset of 2.9 eV.

In the AlGaN insulating film expressed as $(AlN)_x(GaN)_{1-x}$, the conduction band offset $\Delta E_C$ and valence band offset $\Delta E_V$ vary continuously with the film composition x. Accordingly, the conduction band offset and valence band offset are formulated as follows:

$$\Delta E_c = 1.0x - 0.6(1-x) \tag{26}$$

$$\Delta E_v = 3.7x + 2.9(1-x) \tag{27}$$

In the sixth embodiment, alumina has been used as the block insulating film. When a silicon nitride film and a (AlN)$_x$(GaN)$_{1-x}$ stacked insulating film are used as the charge storage layer, it is seen from equation (26) and equation (27) that the requirement of the energy barrier between the charge storage layer and block insulating film is always satisfied.

Specifically, from equation (26), it is seen that the difference between the conduction band offset of the AlGaN insulating film and that of the alumina block insulating film is always higher than 0.9 eV (in equation (10)). In addition, the difference between the valence band offset of the silicon nitride film and that of the alumina on the valence band side is 1.1 eV, which is always higher than 0.8 eV (in equation (11)). Furthermore, it is clear from equation (26) and equation (27) that the condition of the "p-n junction" type stacked insulating film, the other requirement of the invention, is always fulfilled, regardless of the composition of the AlGaN film.

Figure 29:
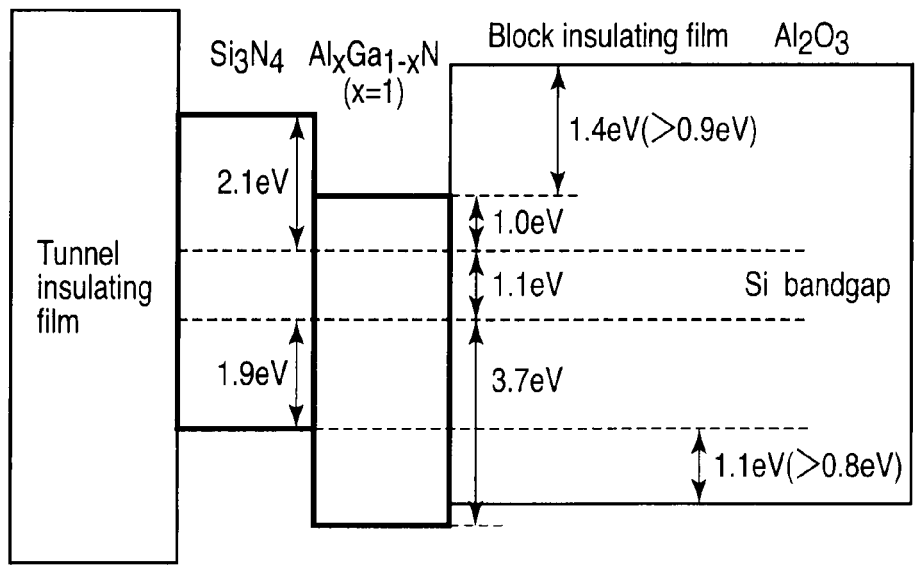
FIG. 29 is a diagram to help explain an energy band structure of the memory cell of the sixth embodiment.

An energy band diagram of the MONOS structure of the sixth embodiment based on the above considerations is shown in FIG. 29.

In the sixth embodiment, the mole fraction x of AlN is x=1 in (AlN)$_x$(GaN)$_{1-x}$. Accordingly, the conduction band offset and valence band offset of the AlN insulating film are at about 1.0 eV and 3.7 eV, respectively. FIG. 29 is an energy band diagram based on this result.

As seen from FIG. 29, both the conduction band offset and the valence band offset in the AlN insulating film in the upper part of the charge storage layer are lower than those in the silicon nitride film in the lower part of the charge storage layer, constituting a "p-n junction" type stacked insulating film. The difference between the lowest energy level at the conduction band edge of the charge storage layer (upper part and lower part) and the energy level at the conduction band edge of the block insulating film is 1.4 eV, which is higher than 0.9 eV (in equation (10)) i.e. the requirement of a potential barrier to electrons in the case of the alumina block film. The difference between the highest energy level (the lowest energy level for holes) at the valence band edge of the charge storage layer (upper part and lower part) and the energy level at the valence band edge of the block insulating film is 1.1 eV, which is higher than 0.8 eV (in equation (11)) i.e. the requirement of a potential barrier to holes in the case of the alumina block film.

For the reasons stated above, it is seen that the MONOS energy band structure of the sixth embodiment satisfies the requirements of the invention. Accordingly, as has been discussed under the heading of "Principle of the invention," reliable MONOS memory cells which are superior in both the write/erase characteristic and retention characteristic can be realized even after having been miniaturized.

(7) Seventh Embodiment

Figure 30:
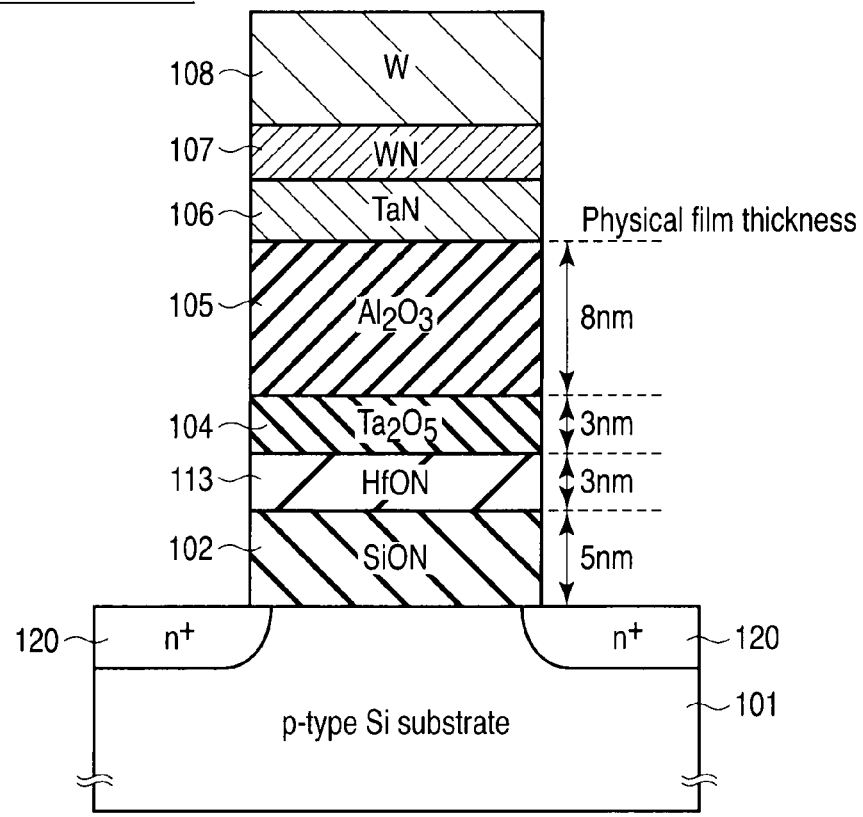
FIG. 30 is a sectional view showing the structure of a memory cell according to a seventh embodiment.

FIG. 30 is a sectional view of a memory cell according to a seventh embodiment of the invention taken in the channel length direction. In FIG. 30, the same parts as those in FIG. 12 are indicated by the same reference numerals and a detailed explanation of them will be omitted.

The seventh embodiment differs from the first embodiment in that the lower part of the charge storage layer is changed from a silicon nitride film to an HfON film. For example, as has been described in H. J. Yang, A. Chin, W. J. Chen, C. F. Cheng, W. L. Huang, I. J. Hsieh, and S. P. McAlister, "A program-Erasable High-k Hf$_{0.3}$N$_{0.2}$O$_{0.5}$ MIS Capacitor With Good Retention," IEEE Electron Device Lett. 28, 913 (2007), the HfON insulating film functions as the charge storage layer. Since the HfON film is a nitrogen-containing film, it has a small valence band offset and is excellent in hole capture.

When the charge storage layer is comprised of a stacked insulating film formed by combining with Ta$_2$O$_5$ or the like which has a potential level suitable for electron capture, the electron trapping position and the hole trapping position can be separated easily. Since the HfON film has a high permittivity, use of the HfON film as a part of the charge storage layer enables the EOT of the MONOS memory cell to be reduced.

Accordingly, in the seventh embodiment, use of an HfON insulating film as a part of the charge storage layer causes not only the power supply voltage of the memory cell to decrease but also a variation in the devices to be reduced.

At the surface of a p-type silicon substrate (including a well) 101, two source/drain diffusion layers 120 are arranged separately. On a channel region between the source/drain diffusion layers 120, for example, a 5-nm-thick silicon oxynitride film (SiON) 102 is arranged as a first insulating film (tunnel insulating film). On the first insulating film 102, for example, a 3-nm-thick hafnium nitride film (HfON) 113 is arranged as the lower part of the charge storage layer. On the lower part 113 of the charge storage layer, for example, a Ta$_2$O$_5$ film 104 of about 3 nm thickness is arranged as the upper part of the charge storage layer.

On the upper part 104 of the charge storage layer, an alumina film 105 of, for example, about 8 nm thickness is arranged as a second insulating film (block insulating film). On the second insulating film 105, a control gate electrode 106 comprised of, for example, a tantalum nitride film is arranged. On the control gate electrode 106, barrier metal 107 made of, for example, tungsten nitride (WN) is arranged. On the barrier metal 107, a low-resistance metal film 108 made of tungsten (W) is arranged.

The configuration of the first insulating film (tunnel insulating film) 102, charge storage layers 113, 104, and control gate electrode 106 used in the seventh embodiment may be modified as in the first embodiment.

A method of manufacturing the memory cell of FIG. 30 is almost the same as that in the first embodiment, except for the process of forming an HfON film in the lower part of the charge storage layer. The process can be carried out by forming HfO$_2$ using ALD with HfCl$_4$ and H$_2$O as raw material gases in the temperature range, for example, from 200° C. to 400° C. and then subjecting the HfO$_2$ to plasma nitridation. This manufacturing method is only one example. The memory cell may be formed by another suitable manufacturing method, as well.

Next, the energy band diagram of the MONOS memory cell of the seventh embodiment will be examined. With reference to S. Maikap, T.-Y. Wang, P.-J, Tzeng, C.-H. Lin, T. C. Tien, L. S. Lee, J.-R. Yang, M.-J. Tsai, "Band offsets and charge storage characteristics of atomic layer deposited high-k HfO$_2$/TiO$_2$ multilayers," Appl. Phys. Lett. 90, 262901 (2007), HfO$_2$ has a 1.7-eV conduction band offset and a 3.1-eV valence band offset. In addition, nitrogen-enriched HfON has a 1.5-eV conduction band offset and a 2.15-eV valence band offset.

The valence band offset in this case has been described in, for example, S. J. Wang, J. W. Chai, Y. F. Dong, Y. P. Feng, N. SUtanto, J. S. Pan, and A. C. H. Huan, "Effect of nitrogen incorporation on the electronic structure and thermal stability of HfO$_2$ gate dielectric," Appl. Phys. Lett. 88, 192103 (2006). The valence band offset agrees well with the theoretical calculation result.

On the other hand, since the conduction band offset depends on the electrons on the 5d orbit of Hf, it is conceivable that the conduction band offset will basically not change significantly as a result of nitrogen introduction. However, according to, for example, G. He, G. W. Meng, L. D. Zhang, and M. Liu, "Temperature-dependent interfacial chemical bonding states and band alignment of $HfO_xN_y/SiO_2/Si$ gate stacks," Appl. Phys. Lett. 91, 232910 (2007), the conduction band offset decrease a little as a result of nitrogen introduction, reaching about 1.5 eV.

Figure 31:
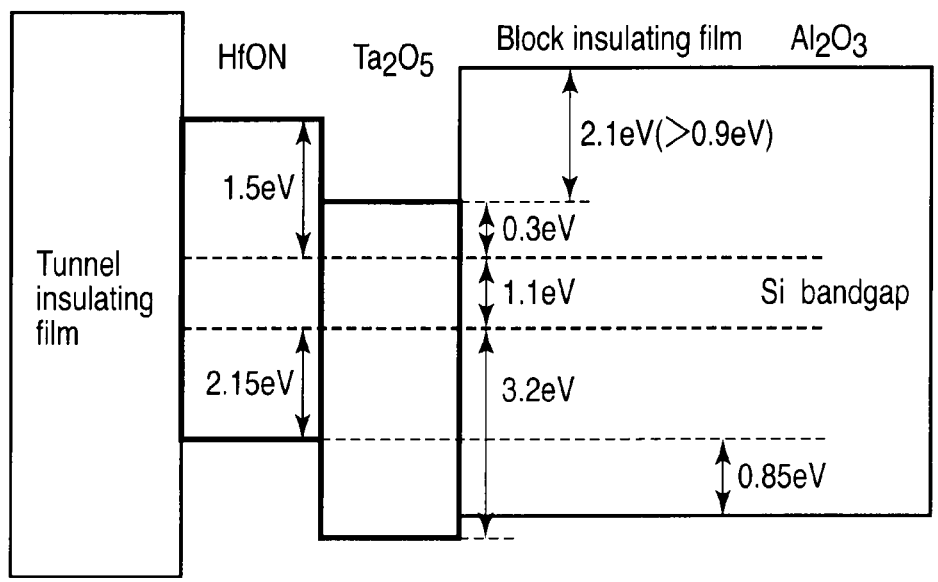
FIG. 31 is a diagram to help explain an energy band structure of the memory cell of the seventh embodiment.

An energy band diagram of the MONOS structure of the seventh embodiment based on the above considerations is shown in FIG. 31. Both the conduction band offset and the valence band offset in the HfON in the lower part of the charge storage layer are lower than those in the $Ta_2O_5$ in the upper part of the charge storage layer. Accordingly, the seventh embodiment realizes the configuration of a "p-n junction" type stacked insulating film.

The difference between the lowest energy level at the conduction band edge of the charge storage layer (upper part and lower part) and the energy level at the conduction band edge of the block insulating film (alumina) is 2.1 eV. This difference is higher than a potential barrier of 0.9 eV to electrons given by equation (10). On the other hand, the difference between the highest energy level (the lowest energy level for holes) at the valence band edge of the charge storage layer (upper part and lower part) and the energy level at the valence band edge of the block insulating film is 0.85 eV. This difference is higher than a potential barrier of 0.8 eV to holes given by equation (11).

For the reasons stated above, it is seen that the MONOS energy band structure of the seventh embodiment satisfies the requirements of the invention. Accordingly, as has been discussed under the heading of "Principle of the invention," reliable MONOS memory cells which are superior in both the write/erase characteristic and retention characteristic can be realized even after having been miniaturized.

(8) Eighth Embodiment

Figure 32:
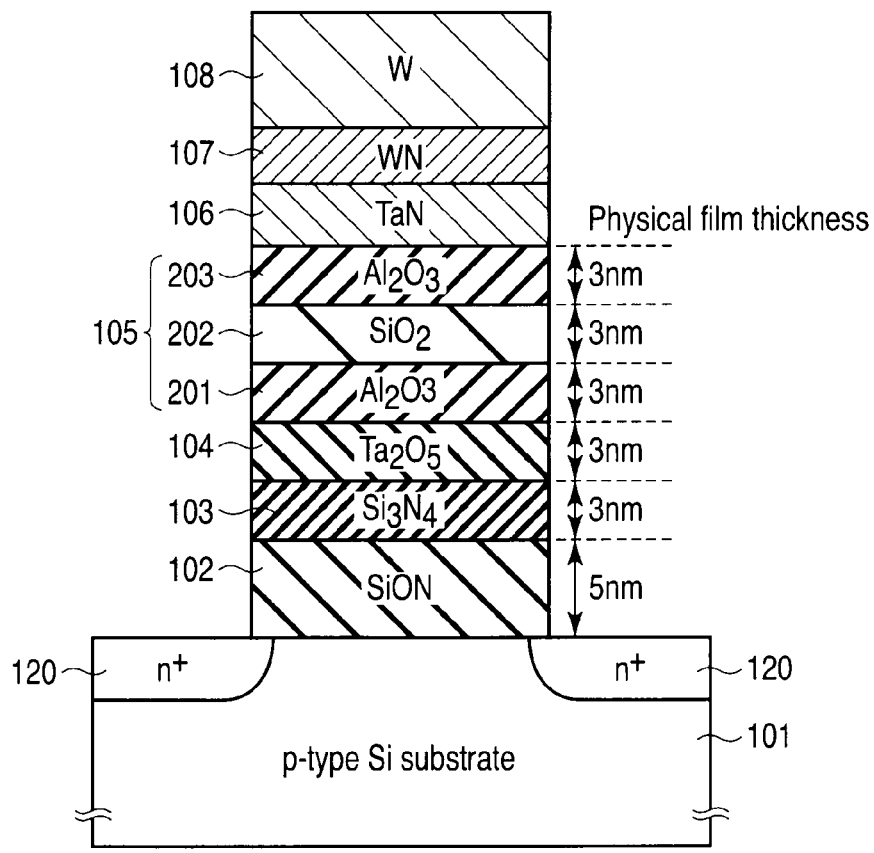
FIG. 32 is a sectional view showing the structure of a memory cell according to an eighth embodiment.

FIG. 32 is a sectional view of a memory cell according to an eighth embodiment of the invention taken in the channel length direction. In FIG. 32, the same parts as those in FIG. 12 are indicated by the same reference numerals and a detailed explanation of them will be omitted.

The eighth embodiment differs from the first embodiment in that the block insulating film is comprised of an alumina/silicon oxide film/alumina stacked film, instead of an alumina single layer. Such a configuration of the block insulating film has the advantage that the leakage current in the block insulating film can be reduced over a wide range from a low electric field to a high electric field.

At the surface of a p-type silicon substrate (including a well) 101, two source/drain diffusion layers 120 are arranged separately. On a channel region between the source/drain diffusion layers 120, for example, a 5-nm-thick silicon oxynitride film (SiON) 102 is arranged as a first insulating film (tunnel insulating film). On the first insulating film 102, for example, a 3-nm-thick silicon nitride film ($Si_3N_4$) 103 is arranged as the lower part of the charge storage layer. On the silicon nitride film 103, for example, a 3-nm-thick tantalum oxide film ($Ta_2O_5$) 104 is arranged as the upper part of the charge storage layer.

On the upper part 104 of the charge storage layer, a stacked film comprised of a 3-nm-thick alumina film 201, a 3-nm-thick silicon oxide film 202, and a 3-nm-thick alumina film 203 is arranged as a second insulating film (block insulating film) 105. On the second insulating film 105, a control gate electrode 106 comprised of, for example, a tantalum nitride film is arranged. On the control gate electrode 106, barrier metal 107 made of, for example, tungsten nitride (WN) is arranged. On the barrier metal 107, a low-resistance metal film 108 made of tungsten (W) is arranged.

A method of manufacturing the memory cell of FIG. 32 is almost the same as that in the first embodiment, except that only the method of depositing the block insulating film is changed. A detailed explanation of the method will be omitted.

A silicon oxide film as a block insulating film intermediate layer can be deposited by LPCVD using dichlorosilane ($SiH_2Cl_2$) and nitrous oxide ($N_2O$) as raw material gases in the temperature range, for example, from 600° C. to 800° C.

In the eight embodiment, although the block insulating film is a stacked film comprised of an alumina/silicon oxide film/alumina, the interpretation of the energy band diagram of the MONOS is basically the same as in the first embodiment (see FIG. 19), since the block insulating film in the region in contact with the charge storage layer is alumina.

Specifically, both the conduction band offset and the valence band offset in the tantalum oxide film in the upper part of the charge storage layer are lower than those in the silicon nitride film in the lower part of the charge storage layer, constituting a "p-n junction" type stacked insulating film.

The difference between the lowest energy level at the conduction band edge of the charge storage layer (upper part and lower part) and the energy level at the conduction band edge of the block insulating film region in contact with the charge storage layer is 2.1 eV, which is higher than the requirement of a potential barrier to electrons expressed by equation (10).

Furthermore, the difference between the highest energy level (the lowest energy level for holes) at the valence band edge of the charge storage layer (upper part and lower part) and the energy level at the valence band edge of the block insulating film region in contact with the charge storage layer is 1.1 eV, which is higher than the requirement of a potential barrier to holes expressed by equation (11).

For the reasons stated above, it is seen that the MONOS energy band structure of the eighth embodiment satisfies the requirements of the invention.

Accordingly, as has been discussed under the heading of "Principle of the invention," reliable MONOS memory cells which are superior in both the write/erase characteristic and retention characteristic can be realized even after having been miniaturized.

(9) Others

Some supplementary explanations to the first to eighth embodiments will be given below.

A. Charge Storage Layer Comprised of Three Layers or More:

An object of the invention is to provide a structure of a charge storage layer capable of keeping sufficiently high the energy barrier between each charge trapping region of the charge storage layer and the block insulating film, and to provide a structure of a charge storage layer capable of physically separating the electron trapping position and the hole trapping position. Although in the embodiments of the invention the charge storage layer has two layers, this does not necessarily mean that the charge storage layer has to be comprised of two layers. For instance, the charge storage layer may have a structure comprised of $Ta_2O_5/Si_3N_4/Ta_2O_5$ or $Si_3N_4/Ta_2O_5/Si_3N_4$. When the charge storage layer with such a structure is used, the charge center position of trapped electrons almost aligns with that of trapped holes because of the symmetrical property of the structure in the film thickness direction. Accordingly, the charge storage layer with the above structure has the advantage that the threshold voltage of a write operation is symmetrical with that of an erase operation in the MONOS memory cell, which makes it possible to provide a memory cell suitable for the circuit configuration of a NAND flash memory.

B. Adding Nitrogen to the High-k Insulating Film of the Charge Storage Layer:

In the embodiments of the invention, examples of metal oxide, including $Ta_2O_5$, TaHfO, TaTiO, and TaAlO, have been used as a layer comprised of a high-permittivity (high-k) insulating film of the charge storage layer. However, this does not necessarily mean that the charge storage layer has to be made of metal oxide. For instance, a film obtained by adding a trace of nitrogen to each of the above metal oxides may be used. Alternatively, a trace of nitrogen may diffuse from the adjacent silicon nitride film unintentionally to each of the metal oxides. Introduction of a trace of nitrogen into the metal oxide produces the effect of improving the reliability of the insulating film. Consequently, the endurance characteristic of the MONOS memory cell is improved.

It should be noted that, when nitrogen is introduced into the part of the high-permittivity (high-k) insulating film of the charge storage layer, the energy band profile varies. Since the invention is characterized by the configuration of the energy band profile of the MONOS memory cell, nitrogen or other impurities may be added to the part of the high-permittivity (high-k) insulating film of the charge storage layer in a range where the energy band profile, a requirement of the invention, is satisfied.

C. Composition of the High-k Insulating Film Region of the Charge Storage Layer:

In the embodiments of the invention, examples of metal oxide to which each of Hf, Ti, and Al has been added to a base material $Ta_2O_5$ have been used as a layer of a high-permittivity (high-k) insulating film in the charge storage layer. However, this does not necessarily mean that the charge storage layer has to be comprised of those materials. For instance, two or more of Hf, Ti, and Al may be selected and added to $Ta_2O_5$ in a range where the requirements of the invention are satisfied. Alternatively, metal elements other than those may be added to $Ta_2O_5$. An example of forming an insulating film (single-layer film) which includes all of Ta, Hf, Ti, and Al has been described in N. Lu, H.-J. Li, M. Gardner, S. Wickramanayaka and D.-L. Kwong, "Electrical Properties of Amorphous High-k HfTaTiO Gate Dielectric With Dielectric Constants of 40-60," IEEE Electron Device Lett. 26, 298 (2005).

D. Replacement of the Silicon Nitride Film as a Part of the Charge Storage Layer:

While in the embodiments of the invention the region of the silicon nitride film has been replaced with HfON, the replacement is not limited to HfON. Generally, in the band profiles of many high-permittivity (high-k) insulating films, the conduction band offset is small and the valence band offset is large. That is, many high-k insulating films function as a so-called "n-type" insulating film. With functioning a high-k insulating film as a replacement of a silicon nitride film in mind, for sufficient hole trapping, it is necessary to make the valence band offset smaller to make a high-k insulating film approximate to a "p-type" insulating film. One method to obtain this is to dope a large amount of nitrogen to a high-k insulating film. Nitrogen-doped metal oxynitrides include not only HfON but also HfAlON, HfSiON, ZrAlON, ZrSiON, and others. Another method of making the valence band offset smaller is to add a rare-earth element, such as La, Ce, or Y to a high-k insulating film, thereby increasing the conduction band offset without changing the bandgap.

E. Stacking Sequence of the Charge Storage Layer:

In most of the embodiments, a silicon nitride film is arranged on the tunnel insulating film side and a Ta-containing high-k insulating film is arranged on the block insulating film side. The reason for this is as follows. In an example of the invention, when a silicon nitride film and a high-k insulating film are stacked, the high-k insulating film mainly captures electrons. The more the high-k insulating film is separated from the tunnel insulating film, the better the retention characteristic. This is the reason for the stacking sequence of the charge storage layer. It is desirable that the retention characteristic be good, since many threshold voltage levels are produced on the electron writing side in an ordinary multilevel operation.

More general consideration on this matter is as follows. To attach greater importance to a good retention characteristic for electrons, it is preferable to arrange a layer containing less nitrogen (or a layer containing no nitrogen) as close to the block insulating film as possible. In other words, it is preferable to arrange a layer containing more nitrogen as close to the tunnel insulating film as possible. The insulating film containing more nitrogen has a smaller valence band offset and therefore can capture holes efficiently. Consequently, it is advantageous to arrange the nitrogen-rich layer in a region close to the tunnel insulating film from the viewpoint of increasing the efficiency of the erase operation, as well.

Here, it cannot be said that there is no application where more importance is attached to the writing efficiency and write threshold voltage window than the retention characteristic. In this case, a high-k insulating film is arranged on the tunnel insulating film side. In other words, it is generally preferable to arrange a layer containing less nitrogen as close to the tunnel insulating film as possible in this case.

F. Tunnel Insulating Film:

In the embodiments of the invention, a silicon oxynitride film has been used as the first insulating film (tunnel insulating film). What can be used as the tunnel insulating film is not restricted to a silicon oxynitride film. For instance, a three-layer structure tunnel insulating film, such as a silicon oxide film/silicon nitride film/silicon oxide film, may be used. As described in, for example, S.-C. Lai, H.-T. Lue, M.-J. Yang, J.-Y. Hsieh, S.-Y. Wang, T.-B. Wu, G.-L. Luo, C.-H. Chien, E.-K. Lai, K.-Y. Hsieh, R. Liu, and C.-y. Lu, "MA ME-SONOS: A Bandgap Engineered SONOS using Metal Gate and $Al_2O_3$ Blocking Layer to Overcome Erase Saturation," pp. 88-89 in Proc. 22nd IEEE Non-Volatile Semiconductor Memory Workshop (2007), this type of tunnel insulating film has an improved erasing characteristic. In addition, a Si-dot-containing double barrier tunneling film may be used in the central part of $SiO_2$.

G. Relationship Between the Tunnel Insulating Film and the Charge Storage Layer:

The tunnel insulating film and charge storage layer may differ or be the same in structure and materials. For instance, both the tunnel insulating film and the charge storage layer may be made of a nitride (e.g., $Si_3N_4$).

H. Block Insulating Film:

In the embodiments of the invention, alumina has been used for the block insulating film. However, the block insulating film is not restricted to alumina. The block insulating film may be made of a metal oxide made mostly of alumina. Here, the metal oxide made mostly of alumina means a metal oxide whose Al composition ratio, number of Al atoms, or Al atom density is greater than the other metal elements included in the metal oxide.

The block insulating film should be comprised of an oxide, a nitride, or an oxynitride of a material containing at least one of Al, Hf, La, Y, Ce, Ti, Zr and Si. For instance, HfAlO, HfAlON, LaAlO, LaAlON, LaAlSiO, LaAlSiON, HfSiO, HfSiON, ZrAlO, ZrAlON, ZrSiO, or ZrSiON may be used for the block insulating film.

Furthermore, the block insulating film is not necessarily restricted to a single-layer film. For instance, an alumina/a silicon oxide film/alumina stacked film or using the aforementioned various high-k insulating film materials, a stacked film, such as a high-k/silicon oxide (oxynitride) film/a high-k film or high-k/a silicon oxide (oxynitride) film, may be formed.

In the case of a stacked block insulating film, the conduction band offset may be represented by a layer whose conduction band is in the highest energy position. In addition, the valence band offset may be represented by a layer with the lowest energy position (or a layer with the highest energy to holes).

I. Gate Electrode:

In the embodiments of the invention, TaN has been used for the control gate electrode. However, the control gate electrode is not necessarily restricted to TaN. Not only polycrystalline silicon but also other metal materials or silicide materials may be used. Examples of such materials include a metal material including one or more of Pt, W, Ir, Ru, Re, Mo, Ti, Ta, Ni, and Co, a silicide of a material including one or more of Pt, W, Ti, Ta, Ni, and Co, a carbide of a material including one or more of W, Ti, and Ta, a nitride of a material including one or more of W, Mo, Ti, and Ta, a silicon nitride of a material including Ti, a compound of these, and a mixture of these.

For instance, the control gate electrode is made of Pt, W, Ir, $IrO_2$, Ru, $RuO_2$, Re, TaC, TaN, Mo, $MoN_x$, $MoSi_x$, TiN, TiC, TiSiN, TiCN, Ni, $Ni_xSi$, $PtSi_x$, WC, WN, or $WSi_x$.

J. About an Interface Layer:

There may be a very thin interface layer between the tunnel insulating film and the charge storage layer, between the charge storage layer and the block insulating film, and between the block insulating film and the control gate electrode. Accordingly, the invention includes a case where there is an interface layer in each of the regions between them. Here, the interface layer is not a layer intentionally formed by an independent process but is a layer additionally formed during a process, such as an ultrathin oxide layer formed by oxidizing the film surface.

4. Examples of Application

An example of the invention may be applied to a memory cell which has a charge storage layer comprised of an insulating film and to a nonvolatile semiconductor memory device which includes such a memory cell, and more particularly to a NAND flash memory.

In the embodiments of the invention, a stacked film has been used as the charge storage layer. The concept of the invention may also be applied to a case where the charge storage layer is not a complete stacked layer but is similar to a continuous film.

The invention is basically characterized by the configuration of the charge storage layer and block insulating film. Accordingly, the invention is not necessarily applied to MONOS memory cells or SONOS memory cells. The invention may be applied to a MONS memory cell where the tunnel insulating film is comprised of the same material as that of the bottom layer of the charge storage layer or a MNOS memory cell where the block insulating film is comprised of the same material as that of the top layer of the charge storage layer. For the same reason, the concept of the invention may be used regardless of the dopant impurity distribution on the substrate side. Consequently, the invention may be applied to, for example, a D (depression)-type NAND cell where a memory cell has no source-drain diffusion layer.

Moreover, for the same reason, the stacked gate structure related to the example of the invention is not necessarily formed on the silicon (Si) substrate. For instance, the stacked gate structure of the invention may be formed on a well region formed in the silicon substrate. In place of the silicon substrate, an SiGe substrate, a Ge substrate, or an SiGeC substrate may be used. The memory cell structure of the invention may be formed on a well region in these substrates.

In the example of the invention, an SOI (silicon on insulating material), an SGOI (silicon-germanium on insulating material), or a GOI (germanium on insulating material) substrate where a thin-film semiconductor is formed on an insulating film may be used. The stacked gate structure of the invention may be formed on a well region in the substrates.

Moreover, in the embodiments of the invention, the memory cell structure of the n-channel transistor on the p-type silicon substrate (including a well region) has been described. The memory cell structure may be replaced with the memory cell structure of a p-channel transistor on an n-type silicon substrate (including a well region). In this case, the conduction type of the source or drain diffusion layer is the p type.

In addition, the invention may be applied to a three-dimensional structure memory cell. For instance, the invention may be applied to such a MONOS transistor structure as a FIN (Fin-FET) structure or a gate-all-around structure. Furthermore, the invention may be applied to a vertical MONOS (BiCS: bit cost scalability) structure or a stacked NONOS structure.

The invention can be applied, regardless of the operating method of the MONOS structure. For instance, the invention may be applied to the case of carrying out a multilevel operation by storing charges in a charge storage layer at each of the source end and drain end of a MONOS transistor.

The embodiments of the invention relate to elemental technology in a memory cell and do not depend on the method of connection at the circuit level of a memory cell. Therefore, the invention may be applied not only to a NAND nonvolatile semiconductor memory but also to a NOR, an AND, or a DINOR nonvolatile semiconductor memory, a 2-transistor flash memory formed by combining the advantages of the NOR type and NAND type memories, or a 3-transistor NAND memory which has a structure where a memory cell is sandwiched between two select transistors. Moreover, the invention may be applied to a flash memory which has an architecture that combines a NAND interface with a NOR high-reliability, high-speed readout function.

5. Advantages

According to the invention, it is possible to provide a MONOS memory cell which realizes a charge storage layer that has a high charge capture efficiency and suppresses the charge emission rate even if the cell is miniaturized further and which achieves superior performance in all aspects of the programming, erasing, retention, and endurance characteristics.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A memory cell of a nonvolatile semiconductor memory device comprising:
a first insulating film which is arranged on a semiconductor substrate;
a charge storage layer which is arranged on the first insulating film and which includes insulating material layers;
a second insulating film which is arranged on the charge storage layer and whose permittivity is higher than that of the first insulating film; and
a control gate electrode which is arranged on the second insulating film,
wherein, when the insulating material layers included in the charge storage layer are represented as i=1, 2, ..., n, starting from the first insulating film toward the second insulating film, the conduction band edge energy of each of the insulating material layers is expressed as $\phi_{c,i}$ (i=1, 2, ..., n), and the valence band edge energy of each of the insulating material layers is expressed as $\phi_{v,i}$ (i=1, 2, ..., n), the conduction band edge energy and valence band edge energy of adjacent layers of the insulating material layers satisfy one of ($\phi_{c,i+1} > \phi_{c,i}$ and $\phi_{v,i+1} > \phi_{v,i}$) and ($\phi_{c,i+1} < \phi_{c,i}$ and $\phi_{v,i+1} < \phi_{v,i}$) where i=1, 2, ..., n−1
and, when the relative permittivity of the second insulating film is expressed as $\in_r$, a potential barrier to electrons defined as the difference between the lowest conduction band edge energy level in the charge storage layer and conduction band edge energy level in the second insulating film is not lower than 4.5 $\in_r^{-2/3}$ (eV) nor higher than 3.8 (eV) and a potential barrier to holes defined as the difference between the highest valence band edge energy level in the charge storage layer and the valance band edge energy level in the second insulating film is equal to or larger than 4.5 $\in_r^{-2/3}$ (eV) and is equal to or smaller than 3.8 (eV).

2. The memory cell according to claim 1, wherein the insulating material layers include an insulating material layer containing nitrogen and an oxide layer containing a metal element.

3. The memory cell according to claim 2, wherein the insulating material layer containing nitrogen is arranged on the side of the first insulating film and the oxide layer containing a metal element is arranged on the side of the second insulating film.

4. The memory cell according to claim 2, wherein the insulating material layer containing nitrogen is arranged on the side of the second insulating film and the oxide layer containing a metal element is arranged on the side of the first insulating film.

5. The memory cell according to claim 2, wherein the insulating material layer containing nitrogen includes silicon nitride.

6. The memory cell according to claim 2, wherein the insulating material layer containing nitrogen includes hafnium oxynitride.

7. The memory cell according to claim 2, wherein the oxide layer containing a metal element includes tantalum.

8. The memory cell according to claim 7, wherein the oxide layer containing a metal element further includes at least one of hafnium, titanium, and aluminum.

9. The memory cell according to claim 8, wherein a region of the second insulating film is in contact with the charge storage layer and includes alumina.

10. The memory cell according to claim 9, wherein the oxide layer containing a metal element includes tantalum and hafnium, and when its composition is expressed as $(HfO_2)_x(Ta_2O_5)_{1-x}$, the composition range is 0<x<0.92.

11. The memory cell according to claim 9, wherein the oxide layer containing a metal element includes tantalum and titanium, and when its composition is expressed as $(TiO_2)_x(Ta_2O_5)_{1-x}$, the composition range is 0<x<0.87.

12. The memory cell according to claim 9, wherein the oxide layer containing a metal element includes tantalum and aluminum, and when its composition is expressed as $(Al_2O_3)_x(Ta_2O_5)_{1-x}$, the composition range is 0<x<0.57.

13. The memory cell according to claim 1, wherein the first insulating film is either one of an oxide film, a nitride film, and an oxynitride film, or a stacked film of them.

14. The memory cell according to claim 1, wherein the second insulating film is made of alumina.

15. The memory cell according to claim 1, further comprising source-drain layers arranged at the surface of the semiconductor substrate so as to be separate from each other,
wherein the first insulating film is arranged on a channel between the source-drain layers.

16. The memory cell according to claim 15, wherein each of the source-drain layers is a diffusion layer.

17. The memory cell according to claim 1, wherein the first insulating film is a tunnel insulating film.

18. The memory cell according to claim 1, wherein the control gate electrode comprises layers stacked one on top of another.

19. The memory cell according to claim 1, wherein the gate length of the memory cell is not longer than 30 nm.

20. A NAND flash memory comprising the memory cell according to claim 1.

* * * * *